United States Patent
Huang et al.

(10) Patent No.: US 9,465,290 B2
(45) Date of Patent: *Oct. 11, 2016

(54) NEAR-INFRARED ABSORBING FILM COMPOSITIONS

(71) Applicant: GLOBALFOUNDRIES INC., Grand Cayman (KY)

(72) Inventors: Wu-Song Huang, Brewster, NY (US); Martin Glodde, Mahwah, NJ (US); Dario L. Goldfarb, Dobbs Ferry, NY (US); Wai-Kin Li, Beacon, NY (US); Sen Liu, Piscataway, NJ (US); Libor Vyklicky, Brno (CZ)

(73) Assignee: GLOBALFOUNDRIES INC., Grand Cayman (KY)

( * ) Notice: Subject to any disclaimer, the term of this patent is extended or adjusted under 35 U.S.C. 154(b) by 119 days.

This patent is subject to a terminal disclaimer.

(21) Appl. No.: 14/243,238

(22) Filed: Apr. 2, 2014

(65) Prior Publication Data

US 2014/0210034 A1 Jul. 31, 2014

Related U.S. Application Data

(62) Division of application No. 12/542,970, filed on Aug. 18, 2009, now Pat. No. 8,772,376.

(51) Int. Cl.
| | | |
|---|---|---|
| C09D 5/32 | (2006.01) |
| C09D 163/00 | (2006.01) |
| C08K 5/00 | (2006.01) |
| G03F 7/038 | (2006.01) |
| G03F 7/09 | (2006.01) |
| G03F 7/11 | (2006.01) |
| H01L 51/44 | (2006.01) |

(52) U.S. Cl.
CPC ............ *G03F 7/0388* (2013.01); *G03F 7/038* (2013.01); *G03F 7/091* (2013.01); *G03F 7/11* (2013.01); *H01L 51/447* (2013.01)

(58) Field of Classification Search
None
See application file for complete search history.

(56) References Cited

U.S. PATENT DOCUMENTS

| | | | |
|---|---|---|---|
| 4,026,705 A | 5/1977 | Crivello et al. |
| 4,568,140 A | 2/1986 | Van der Werf et al. |
| 4,575,399 A | 3/1986 | Tanaka et al. |
| 4,681,430 A | 7/1987 | Goel et al. |
| 5,059,808 A | 10/1991 | Tarui et al. |
| 5,113,063 A | 5/1992 | Idesawa |
| 5,294,680 A | 3/1994 | Knors et al. |
| 5,401,618 A | 3/1995 | Chapman et al. |
| 5,723,617 A | 3/1998 | Cuny |
| 5,919,853 A | 7/1999 | Condit et al. |
| 5,945,209 A | 8/1999 | Okazaki et al. |
| 6,069,244 A | 5/2000 | Masuda et al. |
| 6,136,719 A | 10/2000 | Miller et al. |
| 6,214,721 B1 | 4/2001 | Bendik, Jr. et al. |
| 6,306,555 B1 | 10/2001 | Schulz et al. |
| 6,329,121 B2 | 12/2001 | Obayashi et al. |
| 6,579,662 B1 | 6/2003 | Zheng et al. |
| 6,689,518 B1 | 2/2004 | Williams et al. |
| 6,861,201 B2 | 3/2005 | Weed et al. |
| 7,175,949 B1 | 2/2007 | Tao et al. |
| 7,192,691 B2 | 3/2007 | Hirabayashi |
| 7,820,254 B2 | 10/2010 | Harada et al. |
| 8,772,376 B2 * | 7/2014 | Huang ............. G03F 7/091 252/587 |
| 2001/0005278 A1 | 6/2001 | Onomichi et al. |
| 2002/0114966 A1 | 8/2002 | Urano |
| 2004/0180285 A1 | 9/2004 | Tao et al. |
| 2004/0191479 A1 | 9/2004 | Hatakeyama et al. |
| 2005/0202343 A1 | 9/2005 | Fujimaki |
| 2005/0247916 A1 | 11/2005 | McCormick et al. |
| 2006/0057501 A1 | 3/2006 | Wu et al. |
| 2006/0138410 A1 | 6/2006 | Lalbahadoersing et al. |
| 2007/0015082 A1 | 1/2007 | Angelopoulos et al. |
| 2007/0238802 A1 | 10/2007 | Harada et al. |
| 2011/0042771 A1 | 2/2011 | Huang et al. |

FOREIGN PATENT DOCUMENTS

| | | |
|---|---|---|
| JP | 11-77909 | 3/1999 |
| JP | 2001-19898 | 1/2001 |
| JP | 2001-42539 A | 2/2001 |
| JP | 2002-23361 | 1/2002 |
| JP | 2006-58419 | 3/2006 |
| JP | 2007-271745 | 10/2007 |
| JP | 2008-224926 | 9/2008 |

OTHER PUBLICATIONS

Great Britain Examination Report dated Mar. 16, 2015 received from Application No. GB1203634.9.
H.W. Sands Corporation, Jupiter, FL 33477, as product No. SDA4137, http://www.hwsands.com, pp. 1-12 (Nov. 8, 2007).
Narayanan N. et al., "A New Method for the Synthesis of Heptamethine Cyanine Dyes: Synthesis of New Near-Infrared Fluorescent Labels", J. Org. Chem. 60(8):2391-2395 (1995).
Yao S K, "Optical Consideration in Target Alignment Using Nonactinic Wavelength Microscope", Proceedings of SPIE—The International Society for Optical Engineering, vol. 772, pp. 118-123 (1987), AN 1987:587126 CAPLUS, abstract.
English-language machine translation of Japanese Patent Application No. 11-77909 from AIPN Japanese Patent Office National Center for Industrial Property Information and Training, generated Dec. 21, 2009 (15 pages).
International Search Report and Written Opinion dated Apr. 26, 2011 received from the Korean Intellectual Property Office from related Application No. PCT/US2010/044630 and U.S. Appl. No. 12/542,970.

* cited by examiner

*Primary Examiner* — Michael J Feely
(74) *Attorney, Agent, or Firm* — Scully Scott Murphy and Presser

(57) ABSTRACT

A curable liquid formulation comprising: (i) one or more near-infrared absorbing polymethine dyes; (ii) one or more crosslinkable polymers; and (iii) one or more casting solvents. The invention is also directed to solid near-infrared absorbing films composed of crosslinked forms of the curable liquid formulation. The invention is also directed to a microelectronic substrate containing a coating of the solid near-infrared absorbing film as well as a method for patterning a photoresist layer coated on a microelectronic substrate in the case where the near-infrared absorbing film is between the microelectronic substrate and a photoresist film.

8 Claims, 3 Drawing Sheets

NEAR-INFRARED ABSORBING FILM COMPOSITIONS

CROSS REFERENCE TO RELATED APPLICATIONS

This application is a divisional of U.S. patent application Ser. No. 12/542,970, filed on Aug. 18, 2009 (now U.S. Pat. No. 8,772,376), the entire content and disclosure of which are incorporated herein by reference.

BACKGROUND

The present invention generally relates to Z-level correction methods in the patterning of integrated semiconductor wafers.

The alignment and patterning of integrated silicon wafers during semiconductor chip manufacturing involves the application, sensing, and imaging of a photosensitive layer (photoresist) over complex underlying topography. Such buried topography usually consists of a multilayer stack that includes metal, dielectric, insulator or ceramic materials and combinations thereof, which are patterned and provide vertical and in-plane functionality to the chip. Photoresist patterning over such a multilayer stack requires wafer pre-alignment and surface level sensing in order to properly determine the focal plane position on the photoimageable layer. For this purpose, a broadband infrared source and photosensor combination is used to determine the focus position for the photoresist surface. In cases where the underlying topography consists of patterned reflective structures, reflection from such buried microstructures can induce an erroneous focal plane determination. Furthermore, in those cases where a sublayer contains a patterned metallic material (e.g., metals such as copper, aluminum, and tungsten), unwanted reflective notching or specular reflectance can also contribute to incorrect height level determination. Such erroneous focus determination results in image blur and poor contrast, which translates into defective image printing.

Proposed Z-leveling correction methods include the use of highly reflective coatings, such as metal layers on top of underlying topography or height-sensitive alignment devices. In the first case, the metallic layer presents an integration problem at the time of manufacturing a functional three-dimensional structure, and thus, is generally not a viable solution. In the second case, a substrate-specific calibration of the optical leveling system is performed, e.g., with AGILE or an offline calibrat ion method (FEM+'focus mapper'); however, this approach has several drawbacks, including being generally too slow to be performed on every wafer, and within lot (across-wafer and wafer-to-wafer) substrate changes are uncompensated.

Accordingly, there is a need in the art for a Z-leveling correction method which is generally simple to employ, accurate, readily integratable with microelectronic fabrication processes, and which does not suffer from the drawbacks described above.

SUMMARY

The invention generally involves use of a planarizing layer in the form of a near-infrared (NIR) absorbing film containing one or more chromophores (i.e., dyes) having an absorption range partially or completely covering the focus leveling sensor signal in the near-IR region. Such a layer, when applied onto a multilayer stack, functions by blocking broadband NIR radiation by absorption, thus preventing underlying topographic features located at an arbitrary depth within the multilayer stack to be detected by the focus leveling sensor. Sensing only the top wafer surface allows an accurate placement of the photoresist layer within the imaging plane.

In a first aspect, the invention is directed to a curable liquid formulation which includes (i) one or more near-infrared absorbing polymethine dyes, (ii) one or more cross-linkable polymers; and (iii) one or more casting solvents.

In a second aspect, the invention is directed to a curable liquid formulation which includes (i) one or more near-infrared absorbing polymethine dyes having one or more crosslinking groups thereon; and (ii) one or more casting solvents.

In a third aspect, the invention is directed to a solid near-infrared absorbing film which is a crosslinked form of any of the curable liquid formulations described above. In one embodiment, the near-infrared absorbing film includes one or more near-infrared absorbing polymethine dyes and one or more crosslinked polymers. In another embodiment, the near-infrared absorbing film includes one or more near-infrared absorbing polymethine dyes crosslinked by one or more crosslinking groups on the polymethine dyes.

In a fourth aspect, the invention is directed to a microelectronic structure which includes (a) a microelectronic substrate; (b) a solid near-infrared absorbing film, as described above, covering the microelectronic substrate; and (c) a photoresist film covering the near-infrared absorbing film.

In a fifth aspect, the invention is directed to a method for patterning a photoresist layer coated on a microelectronic substrate. The method preferably includes (i) providing a microelectronic substrate; (ii) forming a solid near-infrared absorbing film, as described above, covering the microelectronic substrate; (iii) forming a photoresist layer over the near-infrared absorbing layer; (iv) aligning and focusing a focal plane position of the photoresist layer by sensing near-infrared emissions reflected from the microelectronic substrate containing the near-infrared absorbing layer and photoresist layer; and (v) exposing the photoresist layer to an exposure beam which patterns the photoresist.

Unlike presently known solutions to the problem, the present invention can be used independent of machine model and number, represents little up-front investment, it is not a throughput detractor, requires low maintenance, and may have secondary metrology applications (RIE control, defect detection, etc.).

DETAILED DESCRIPTION OF PARTICULAR EMBODIMENTS

Figure 1:
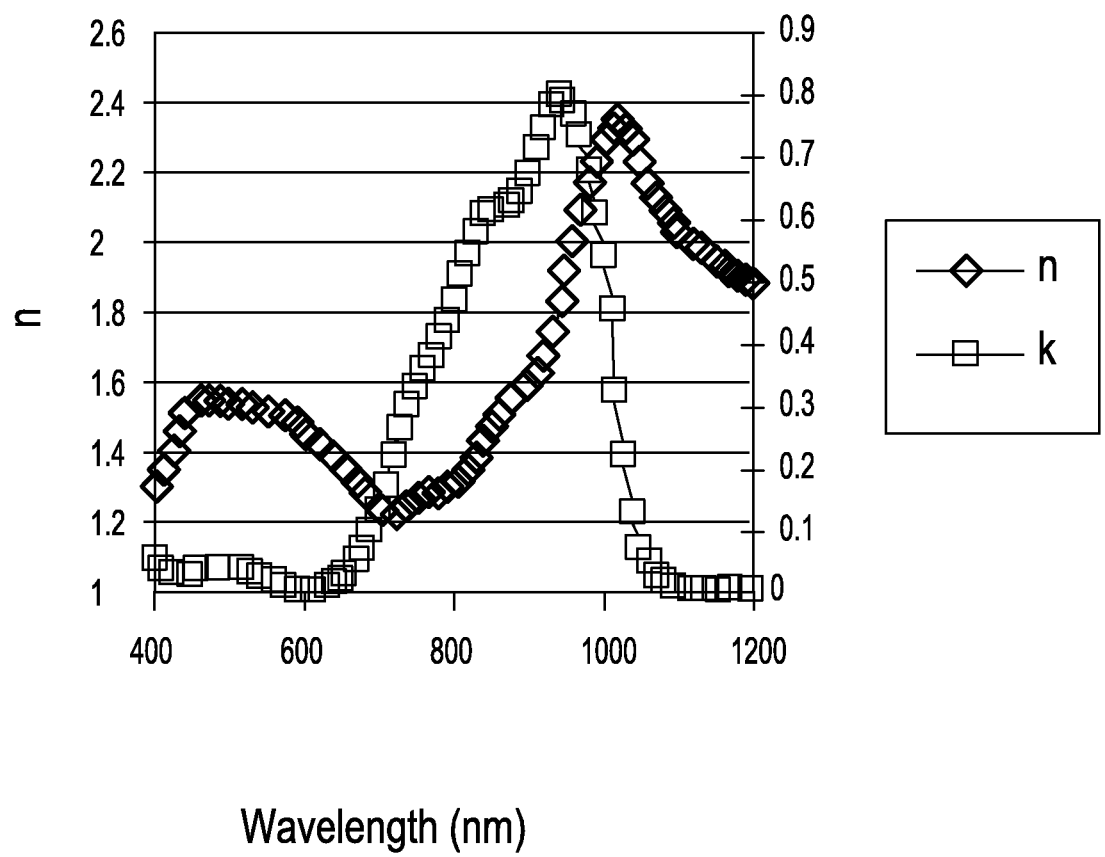
FIG. 1 is a graph showing optical properties of a near-IR absorbing layer of the invention.

The term "hydrocarbon group", as used herein, refers, in a first embodiment, to a chemical group composed solely of carbon and hydrogen. In different embodiments, one or more of the hydrocarbon groups can contain precisely, or a minimum of, or a maximum of, for example, one, two, three, four, five, six, seven, eight, nine, ten, eleven, twelve, thirteen, fourteen, fifteen, sixteen, seventeen, or eighteen carbon atoms, or a particular range of carbon atoms between any of the foregoing carbon numbers.

The hydrocarbon groups can be, for example, saturated and straight-chained (i.e., straight-chained alkyl groups). Some examples of straight-chained alkyl groups include methyl, ethyl, n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, and n-octadecyl groups.

The hydrocarbon groups can alternatively be saturated and branched (i.e., branched alkyl groups). Some examples of branched alkyl groups include isopropyl, isobutyl, sec-butyl, t-butyl, isopentyl, neopentyl, 2-methylpentyl, 3-methylpentyl, and the numerous $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ saturated and branched hydrocarbon groups.

The hydrocarbon groups can alternatively be saturated and cyclic (i.e., cycloalkyl groups). Some examples of cycloalkyl groups include cyclopropyl, cyclobutyl, cyclopentyl, cyclohexyl, cycloheptyl, and cyclooctyl groups. The cycloalkyl group can also be a polycyclic (e.g., bicyclic) group by either possessing a bond between two ring groups (e.g., dicyclohexyl) or a shared (i.e., fused) side (e.g., decalin and norbornane).

The hydrocarbon groups can alternatively be unsaturated and straight-chained (i.e., straight-chained olefinic or alkenyl groups). Some examples of straight-chained olefinic groups include vinyl, 2-propen-1-yl, 3-buten-1-yl, 2-buten-1-yl, butadienyl, 4-penten-1-yl, 3-penten-1-yl, 2-penten-1-yl, 2,4-pentadien-1-yl, 5-hexen-1-yl, 4-hexen-1-yl, 3-hexen-1-yl, 3,5-hexadien-1-yl, 1,3,5-hexatrien-1-yl, 6-hepten-1-yl, ethynyl, propargyl(2-propynyl), and the numerous $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ unsaturated and straight-chained hydrocarbon groups.

The hydrocarbon groups can alternatively be unsaturated and branched (i.e., branched olefinic or alkenyl groups). Some examples of branched olefinic groups include 2-propen-2-yl, 3-buten-2-yl, 3-buten-3-yl, 4-penten-2-yl, 4-penten-3-yl, 3-penten-2-yl, 3-penten-3-yl, 2,4-pentadien-3-yl, and the numerous $C_6$, $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ unsaturated and branched hydrocarbon groups.

The hydrocarbon groups can alternatively be unsaturated and cyclic (i.e., cycloalkenyl groups or cycloalkenylene linkers). Some examples of unsaturated and cyclic hydrocarbon groups include cyclopropenyl, cyclobutenyl, cyclopentenyl, cyclopentadienyl, cyclohexenyl, cyclohexadienyl, phenyl, benzyl, cycloheptenyl, cycloheptadienyl, cyclooctenyl, cyclooctadienyl, and cyclooctatetraenyl groups. The unsaturated cyclic hydrocarbon group can also be a polycyclic (e.g., bicyclic or tricyclic) group by either possessing a bond between two of the ring groups (e.g., biphenyl) or a shared (i.e., fused) side (e.g., naphthalene, anthracene, and phenanthrene).

The hydrocarbon groups may also include one or more heteroatoms, such as one or more oxygen, nitrogen, sulfur, or halide atoms. In different embodiments, the hydrocarbon group may include only one or more nitrogen atoms and no other heteroatoms, or only one or more oxygen atoms and no other heteroatoms, or only sulfur atoms and no other heteroatoms, or only nitrogen and oxygen and not sulfur, or only nitrogen and sulfur and not oxygen, or only oxygen and sulfur and not nitrogen. Some particular examples of oxygen-containing groups include those of formula —$XR_8$ wherein X is O or S and $R_8$ is a hydrogen atom or a hydrocarbon group as described above or optionally containing one or more heteroatoms selected from oxygen, nitrogen, and sulfur atoms. Other oxygen-containing groups include carbonyl groups (e.g., ketone, aldehyde, ester, amide, or urea functionalities). The —$XR_8$ group can also be a polyalkyleneoxide group, such as a polyethyleneoxide group. Some particular examples of nitrogen-containing groups include those of formula —$NR_9R_{10}$ wherein $R_9$ and $R_{10}$ are each independently a hydrogen atom or hydrocarbon group optionally containing one or more heteroatoms selected from oxygen, nitrogen, and sulfur atoms. In addition, the nitrogen-containing groups can be primary amine groups, secondary amine groups, tertiary amine groups, or quaternary amine groups. Some other nitrogen-containing groups may include cyanide, amide (i.e., —$C(O)NR_2$, wherein R is selected from hydrogen atom and hydrocarbon group), nitro group, urea group, and carbamate group, wherein it is understood that a quaternary amine group necessarily possesses a positive charge and requires a counteranion. Some examples of sulfur-containing groups include the thioether (i.e., sulfide), disulfide, sulfoxide, sulfone, sulfonate, and sulfate groups. Halide atoms considered herein include fluorine, chlorine, bromine, and iodine. Some examples of fluorine-containing hydrocarbon groups (i.e., fluorocarbon groups) include the partially-substituted varieties (e.g., fluoromethyl, difluoromethyl, 2-fluoroethyl, 2,2-difluoroethyl, 2,2,2-trifluoroethyl, and the like) and perfluoro-substituted varieties (e.g., perfluoromethyl, perfluoroethyl, perfluoropropyl, perfluorobutyl, and the like).

The hydrocarbon group can also include a ring structure (e.g., a monocyclic ring or polycyclic ring system) which contains one or more (e.g., one, two, three, or four) ring nitrogen atoms. The nitrogen-containing rings can be, for example, saturated monocyclic, saturated polycyclic, unsaturated monocyclic, or unsaturated polycyclic. In one embodiment, the nitrogen-containing ring groups or ring systems can also include other ring heteroatoms, such as oxygen or sulfur atoms. In another embodiment, the nitrogen-containing ring groups or ring systems exclude other ring heteroatoms. Some examples of saturated monocyclic nitrogen-containing ring groups include pyrrolidine, piperidine, piperazine, and morpholine groups. Some examples of unsaturated monocyclic nitrogen-containing ring groups include pyrrole, imidazole, pyrazole, pyridine, pyrazine, 1,3,5-triazine, pyrimidine, oxazole, thiazole, and thiazine groups. Some examples of saturated polycyclic nitrogen-containing ring systems include decahydroquinoline and decahydro-1,8-naphthyridine groups. Some examples of unsaturated polycyclic nitrogen-containing ring systems include indole, purine, benzimidazole, 4,4'-bipyridine, 2,2'-bipyridine, 1,8-naphthyridine, quinoline, quinazoline, phenazine, benzoxazole, benzothiazole, 2-phenylpyridine, 2,6-diphenylpyridine, and benzothiazine groups.

The hydrocarbon group can also include a ring structure which contains one or more (e.g., one, two, three, or four) ring oxygen atoms. The oxygen-containing rings can be, for example, saturated monocyclic, saturated polycyclic, unsaturated monocyclic, or unsaturated polycyclic. In one embodiment, the oxygen-containing ring groups or ring systems can also include other ring heteroatoms, such as nitrogen or sulfur atoms. In another embodiment, the oxygen-containing ring groups or ring systems exclude other ring heteroatoms. Some examples of saturated monocyclic oxygen-containing ring groups include tetrahydrofuran, tetrahydropyran, 1,4-dioxane, 1,3-dioxane, 1,3-dioxolane, and 1,4-oxathiane groups. Some examples of unsaturated monocyclic oxygen-containing ring groups include furan, pyran, and 1,4-dioxine groups. An example of a saturated polycyclic oxygen-containing ring system includes the octahydro-1-benzopyran group. Some examples of unsaturated polycyclic oxygen-containing ring systems include 1-benzopyran(chromene), 2-benzopyran(isochromene), 2-phenylfuran, 2-phenylpyran, coumarin, and 1,4-benzopyrone(chromone) groups.

The hydrocarbon group can also include a ring structure which contains one or more (e.g., one, two, three, or four) ring sulfur atoms. The sulfur-containing rings can be, for example, saturated monocyclic, saturated polycyclic, unsaturated monocyclic, or unsaturated polycyclic. In one embodiment, the sulfur-containing ring groups or ring systems can also include other ring heteroatoms, such as nitrogen or oxygen atoms. In another embodiment, the sulfur-containing ring groups or ring systems exclude other ring heteroatoms. Some examples of saturated monocyclic sulfur-containing ring groups include tetrahydrothiofuran, tetrahydrothiopyran, 1,4-dithiane, 1,3-dithiane, 1,2-dithiolane, and 1,4-dithiolane groups. Some examples of unsaturated monocyclic sulfur-containing ring groups include thiophene, thiopyran, and 1,4-dithiine groups. An example of a saturated polycyclic sulfur-containing ring system includes the octahydro-1-benzothiopyran group. Some examples of unsaturated polycyclic sulfur-containing ring systems include 1-thiobenzopyran(thiochromene), 2-benzothiopyran (isothiochromene), 2-phenylthiophene, 2-phenylthiofuran, 2,6-diphenylthiopyran, and thiocoumarin groups.

In one aspect, the invention is directed to a curable liquid formulation which includes (i) one or more near-infrared (NIR) absorbing polymethine dyes (i.e., "dyes"), (ii) one or more crosslinkable polymers; and (iii) one or more casting solvents. In another aspect, the invention is directed to a curable liquid formulation which includes (i) one or more near-infrared absorbing polymethine dyes having one or more crosslinking groups thereon; and (ii) one or more casting solvents. In the particular case where the dye molecule includes one or no crosslinkable groups, inclusion of one or more crosslinkable polymers is desirable in the liquid formulation to render the liquid formulation curable. In the particular case where the dye molecule includes at least two crosslinkable groups, a crosslinkable polymer can be included, if desired, but can be dispensed with if crosslinking only between dye molecules is desired.

The one or more dyes can be any polymethine dye which absorb near-infrared wavelengths of electromagnetic radiation. The near-infrared wavelengths being considered herein broadly encompass any of the wavelengths within 500 nm to 5,000 nm. In different embodiments, the dye absorbs near-infrared wavelengths in a range bounded by a minimum wavelength of, for example, 400 nm, 450 nm, 500 nm, 550 nm, 600 nm, 650 nm, 700 nm, 750 nm, 800 nm, or 850 nm, and a maximum wavelength of, for example, 700 nm, 750 nm, 800 nm, 850 nm, 900 nm, 950 nm, 1000 nm, 1050 nm, 1100 nm, 1150 nm, 1200 nm, 1250 nm, 1300 nm, 1400 nm, 1500 nm, 2000 nm, 2500 nm, 3000 nm, 3500 nm, 4000 nm, 4500 nm, and 5000 nm. Any range governed by any combination of the foregoing minimum and maximum values are applicable herein. Moreover, the dyes are preferably passive, i.e., not photoactive. The foregoing exemplary absorption ranges can be achieved either by use of a single dye, or alternatively, by use of more than one dye (e.g., two, three, or four dyes).

A subclass of polymethine dyes being considered herein are the cyanines. The cyanines can further be classified as streptocyanines (i.e., open chain cyanines), hemicyanines (i.e., half-open chain cyanines), and closed chain cyanines.

Preferably, the polymethine dyes considered herein have a formula within the following generic formula:

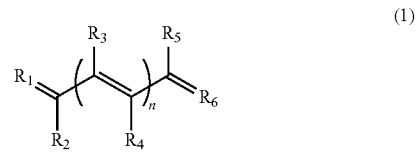

(1)

In one embodiment of formula (1) above, $R_1$ or a cyclic interconnection of $R_1$ and $R_2$ represents any of the nitrogen-, oxygen-, and/or sulfur-containing monocyclic ring or polycyclic ring systems described above. Likewise, in an independent manner, $R_6$ or a cyclic interconnection of $R_5$ and $R_6$ represents any of the nitrogen-, oxygen-, and/or sulfur-containing monocyclic ring or polycyclic ring systems described above. When the heteroatom-containing monocyclic ring or polycyclic ring system is represented by $R_1$ and/or $R_6$, the ring or polycyclic ring system can be bound by any of its carbon atoms or heteroatoms to the indicated olefinic bond, while $R_2$ and/or $R_5$, respectively, can be any of the hydrocarbon groups described above. In addition, one or more of the nitrogen, oxygen, or sulfur atoms of the heteroatom-containing monocyclic ring or polycyclic ring system can be either in a neutral or positively charged state, and if in a positive state, an anion is associated with the polymethine dye.

In another embodiment of formula (1), $R_1$ or a cyclic interconnection of $R_1$ and $R_2$ represents a hydrocarbon group derivatized with one or more acyclic amino groups. Likewise, in an independent manner, $R_6$ or a cyclic interconnection of $R_5$ and $R_6$ represents a hydrocarbon group derivatized with one or more acyclic amino groups. Some examples of hydrocarbon groups derivatized with one or more acyclic amino groups include aniline, N-methylaniline, N-isopropylaniline, N-phenylaniline, N,N-dimethylaniline, and the phenylenediamines.

In formula (1), $R_3$ and $R_4$ (as well as $R_2$ and $R_5$, when these are not interconnected with $R_3$ and $R_4$, respectively) are each independently selected from (i) a hydrogen atom, or (ii) halide atom, or (iii) cyanide group, or (iv) hydroxy group, or (v) a hydrocarbon group containing at least one, two, three, four, five, or six carbon atoms, wherein a hydrocarbon group is as defined above, which can optionally include one or more heteroatoms selected from nitrogen, oxygen, sulfur, and halides, or (vi) a group of formula —$XR_8$ wherein X is O or S and $R_8$ is a hydrocarbon group as defined above, which optionally contains one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group as defined above, which optionally contains one or more heteroatoms selected from oxygen, nitrogen, and sulfur atoms. In addition, when any two of $R_2$, $R_3$, $R_4$, and $R_5$ are hydrocarbon groups, they can interconnect to form a five- or six-membered ring. For example, $R_3$ and $R_4$ or $R_2$ and $R_4$ can together represent a six-membered carbon ring by interlinking $R_3$ and $R_4$ or $R_2$ and $R_4$ when $R_3$ and $R_4$ or $R_2$ and $R_4$ are, for example, ethyl groups (or, e.g., a methyl and n-propyl group).

The subscript n in formula (1) is a value of at least 1 and typically up to 16, wherein a value of n indicates the corresponding number of linked olefinic groups, as indicated. In different embodiments, n can preferably be a value of at least 1, 2, 3, 4, 5, or 6, and up to 7, 8, 9, 10, 11, 12, 13, 14, 15, or 16, or any particular range governed by the foregoing preferred minimum and maximum values.

In formula (1), when n is a value greater than 1, $R_3$ and $R_4$ are independent across different olefinic units, i.e., they may be the same or different between different olefinic units. Furthermore, when n is a value greater than 1, the resulting multiple $R_3$ and $R_4$ groups on adjacent olefinic bonds (conveniently referred to herein as $R_3$ and $R_3'$ or $R_4$ and $R_4'$ pairs, wherein it is understood that $R_3$ and $R_3'$ are separated by a carbon atom bearing an $R_4$ group), can interlink between each other to form a monocyclic ring or polycyclic ring system. Accordingly, formula (1) includes the possibility of more than one ring or ring system (e.g., two, three, or four) established by an interlinked $R_3$ and $R_4$ or an interlinked $R_3$ and $R_3'$ or an interlinked $R_4$ and $R_4'$. Furthermore, the rings or ring systems may be adjacent (i.e., occupy adjacent olefinic groups), fused (e.g., $R_3$ and $R_3'$ interlinking combined with $R_4$ and $R_4'$ interlinking) or be separated by one, two, three, or more non-cyclic olefinic groups.

In a particular embodiment of formula (1), the dye contains an interchain ring while the remaining scope of formula (1) is unchanged. Such dyes are conveniently represented by the following formula:

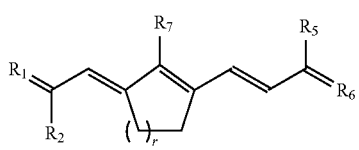

(2)

In formula (2), $R_1$, $R_2$, $R_5$, and $R_6$ groups are as defined above for formula (1) and subscript r is preferably 1 or 2, which results in either a five- or six-membered ring, respectively. The $R_7$ group can be (i) a hydrogen atom, or (ii) halide atom, or (iii) cyanide group, or (iv) hydroxy group, or (v) a hydrocarbon group containing at least one, two, three, four, five, or six carbon atoms, wherein a hydrocarbon group is as defined above, which can optionally include one or more heteroatoms selected from nitrogen, oxygen, sulfur, and halides, or (vi) a group of formula —$XR_8$ wherein X is O or S and $R_8$ is a hydrocarbon group as defined above, which optionally contains one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group as defined above, which optionally contains one or more heteroatoms selected from oxygen, nitrogen, and sulfur atoms.

In another particular embodiment of formula (1), the dye does not contain an interchain ring, and contains a heteroatom-containing monocyclic ring or polycyclic ring system on each end of the dye. Such dyes can be conveniently represented by the following formula:

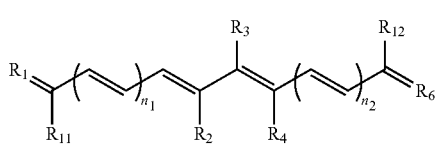

(3)

In formula (3) above, $R_1$ or a cyclic interconnection of $R_1$ and $R_{11}$ represents any of the nitrogen-, oxygen-, and/or sulfur-containing monocyclic ring or polycyclic ring systems described above. Likewise, in an independent manner, $R_6$ or a cyclic interconnection of $R_6$ and $R_{12}$ represents any of the nitrogen-, oxygen-, and/or sulfur-containing monocyclic ring or polycyclic ring systems described above. When the heteroatom-containing monocyclic ring or polycyclic ring system is represented by $R_1$ and/or $R_6$, the ring or polycyclic ring system can be bound by any of its carbon atoms or heteroatoms to the indicated olefinic bond. In addition, when $R_1$ or $R_6$ is a heteroatom-containing monocyclic ring or polycyclic ring system, $R_{11}$ or $R_{12}$, respectively, can be any of the following groups: (i) a hydrogen atom, or (ii) halide atom, or (iii) cyanide group, or (iv) hydroxy group, or (v) a hydrocarbon group containing at least one, two, three, four, five, or six carbon atoms, wherein a hydrocarbon group is as defined above, which can optionally include one or more heteroatoms selected from nitrogen, oxygen, sulfur, and halides, or (vi) a group of formula —$XR_3$ wherein X is O or S and $R_8$ is a hydrocarbon group as defined above, which optionally contains one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group as defined above, which optionally contains one or more heteroatoms selected from oxygen, nitrogen, and sulfur atoms. $R_2$, $R_3$, and $R_4$ can also independently be any of the foregoing groups (i)-(vii). In addition, when any two of $R_2$, $R_3$, and $R_4$ are hydrocarbon groups, they can interconnect to form a five- or six-membered ring, as described above under formula (1).

The subscripts $n_1$ and $n_2$ in formula (3) each independently represent a value of 0 (i.e., the parenthesized olefinic group is absent), or a value of 1, 2, 3, 4, 5, 6, or a particular range therebetween.

In another particular embodiment of formula (1), the dye contains an interchain ring and also contains a heteroatom-containing monocyclic ring or polycyclic ring system on each end of the dye. Such dyes can be conveniently represented by the following formula:

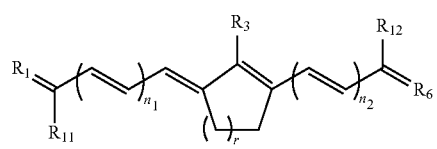

(4)

In formula (4) above, $R_1$ or a cyclic interconnection of $R_1$ and $R_{11}$ represents any of the nitrogen-, oxygen-, and/or sulfur-containing monocyclic ring or polycyclic ring systems described above. Likewise, in an independent manner, $R_6$ or a cyclic interconnection of $R_6$ and $R_{12}$ represents any of the nitrogen-, oxygen-, and/or sulfur-containing monocyclic ring or polycyclic ring systems described above. When the heteroatom-containing monocyclic ring or polycyclic ring system is represented by $R_1$ and/or $R_6$, the ring or polycyclic ring system can be bound by any of its carbon atoms or heteroatoms to the indicated olefinic bond. In addition, when $R_1$ or $R_6$ is a heteroatom-containing monocyclic ring or polycyclic ring system, $R_{11}$ or $R_{12}$, respectively, can be any of the following groups: (i) a hydrogen atom, or (ii) halide atom, or (iii) cyanide group, or (iv) hydroxy group, or (v) a hydrocarbon group containing at least one, two, three, four, five, or six carbon atoms, wherein a hydrocarbon group is as defined above, which can optionally include one or more heteroatoms selected from nitrogen, oxygen, sulfur, and halides, or (vi) a group of formula —$XR_8$ wherein X is O or S and $R_8$ is a hydrocarbon group as defined above, which optionally contains one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group as defined above, which optionally contains one or more heteroatoms selected from oxygen, nitrogen, and sulfur atoms. $R_3$ can also independently be any of the foregoing groups (i)-(vii). Subscripts r, $n_1$, and $n_2$ are as defined above.

In another embodiment of formula (1), the dye can have a formula within the following generic formula:

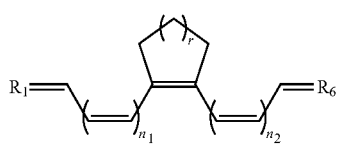

(5)

In formula (5), $R_1$, $R_6$, r, $n_1$, and $n_2$ are as defined above.

In other particular embodiments, the dye of formula (1) has a chemical formula within any of the following generic formulae:

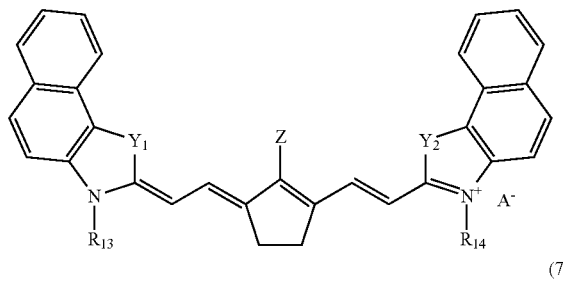

(6)

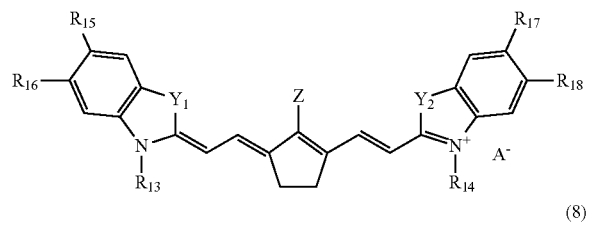

(7)

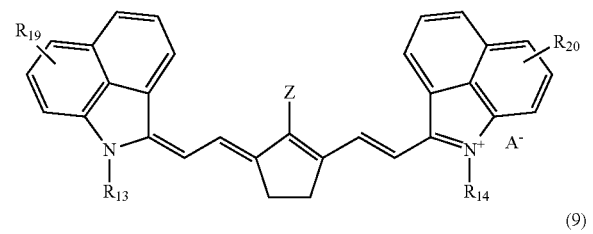

(8)

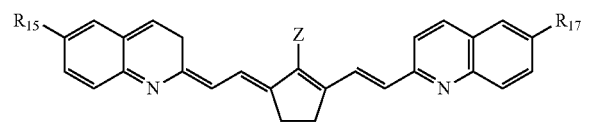

(9)

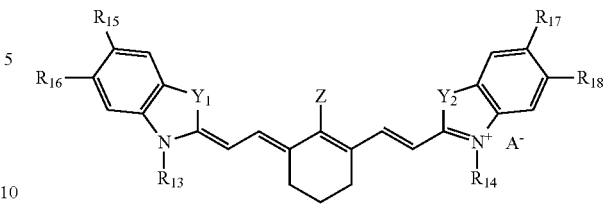

(10)

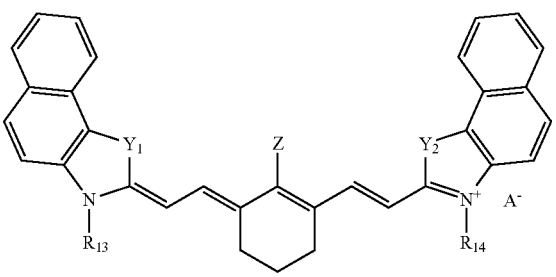

(11)

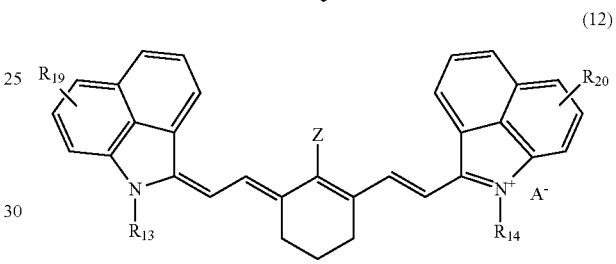

(12)

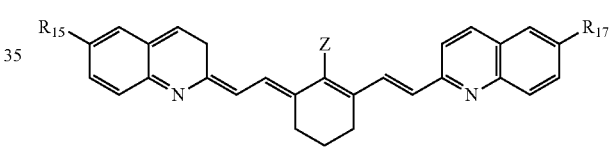

(13)

In the above generic formulae 6-13, $Y_1$ and $Y_2$ are preferably independently selected from N, O, or S heteroatoms, or a $CR_2$ group, wherein R is preferably independently a hydrogen atom or hydrocarbon group of 1 to 4 carbon atoms (e.g., methyl, ethyl, n-propyl, isopropyl, n-butyl, isobutyl, t-butyl, vinyl, and the like). Some particular examples of a $CR_2$ group include —$CH_2$—, —$CH(CH_3)$—, and —$C(CH_3)_2$— groups.

In formulae 6-13, Z and $R_{15}$-$R_{20}$ are preferably independently selected from: (i) a hydrogen atom, or (ii) halide atom, or (iii) cyanide group, or (iv) hydroxy group, or (v) a hydrocarbon group containing at least one, two, three, four, five, or six carbon atoms, wherein a hydrocarbon group is as defined above, which can optionally include one or more heteroatoms selected from nitrogen, oxygen, sulfur, and halides, or (vi) a group of formula —$XR_8$ wherein X is O or S and $R_8$ is a hydrocarbon group as defined above, which optionally contains one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group as defined above, which optionally contains one or more heteroatoms selected from oxygen, nitrogen, and sulfur atoms. $R_2$, $R_3$, and $R_4$ can also independently be any of the foregoing groups (i)-(vii). In particularly preferred embodiments, Z is selected from either a hydrogen atom, a hydrocarbon group containing 1-7 (and more preferably, 1-6, 1-5, or 1-4) carbon atoms (e.g., methyl, ethyl, vinyl, n-propyl, allyl, isopropyl, n-butyl, isobutyl, sec-butyl, t-butyl, n-pentyl, isopentyl, n-hexyl, phenyl, benzyl, tolyl), —S-Ph, —S-Ph-CH₃, —S-Ph-NH₂, —O-Ph, —O-PhCH₃, —O-PhNH₂, —N(Ph)₂, and —N(CH₃)₂, where Ph indicates a phenyl (or phenylene) group.

$R_{13}$ and $R_{14}$ can be any of the hydrocarbon groups described above, and more preferably, a hydrocarbon group of up to 12 carbon atoms, and more preferably, saturated hydrocarbon groups (and particularly, straight-chained or branched alkyl groups, e.g., alkyl groups of 1-8 carbon atoms, such as n-butyl or isobutyl). The $R_{13}$ and $R_{14}$ groups can be optionally derivatized with one or more heteroatoms or heteroatom-containing groups, as described above. In a preferred embodiment, one or both of the $R_{13}$ and $R_{14}$ groups are derivatized with one or more (e.g., 1, 2, 3, or 4) hydroxy or alkoxy groups of formula —$OR_8$ wherein $R_8$ is defined above. Furthermore, it is preferred that at least one of the —$OR_8$ groups is located at the terminal end of the $R_{13}$ or $R_{14}$ group (e.g., as —(CH₂)$_n$OR₈, where n is 1-12).

The anion $A^-$ can be any of the anions known in the art. Some particularly preferred examples include $SbF_6^-$, $I^-$, $ClO_4^-$, $CH_3SO_3^-$, $C_2F_5SO_3^-$, $C_4F_9SO_3^-$, $N(SO_2CF_3)_2^-$, $N(SO_2C_2F_5)_2^-$, $N(SO_2C_3F_7)_2$, $N(SO_2C_4F_9)_2$, and $C(SO_2CF_3)_3^-$.

In a particularly preferred embodiment of formula (6), $Y_1$ and $Y_2$ are —C(CH₃)₂— groups, $R_{13}$ and $R_{14}$ are n-butyl groups, and Z is a —S-Ph group (where Ph is phenyl).

Some particular examples of dyes according to the present invention include:

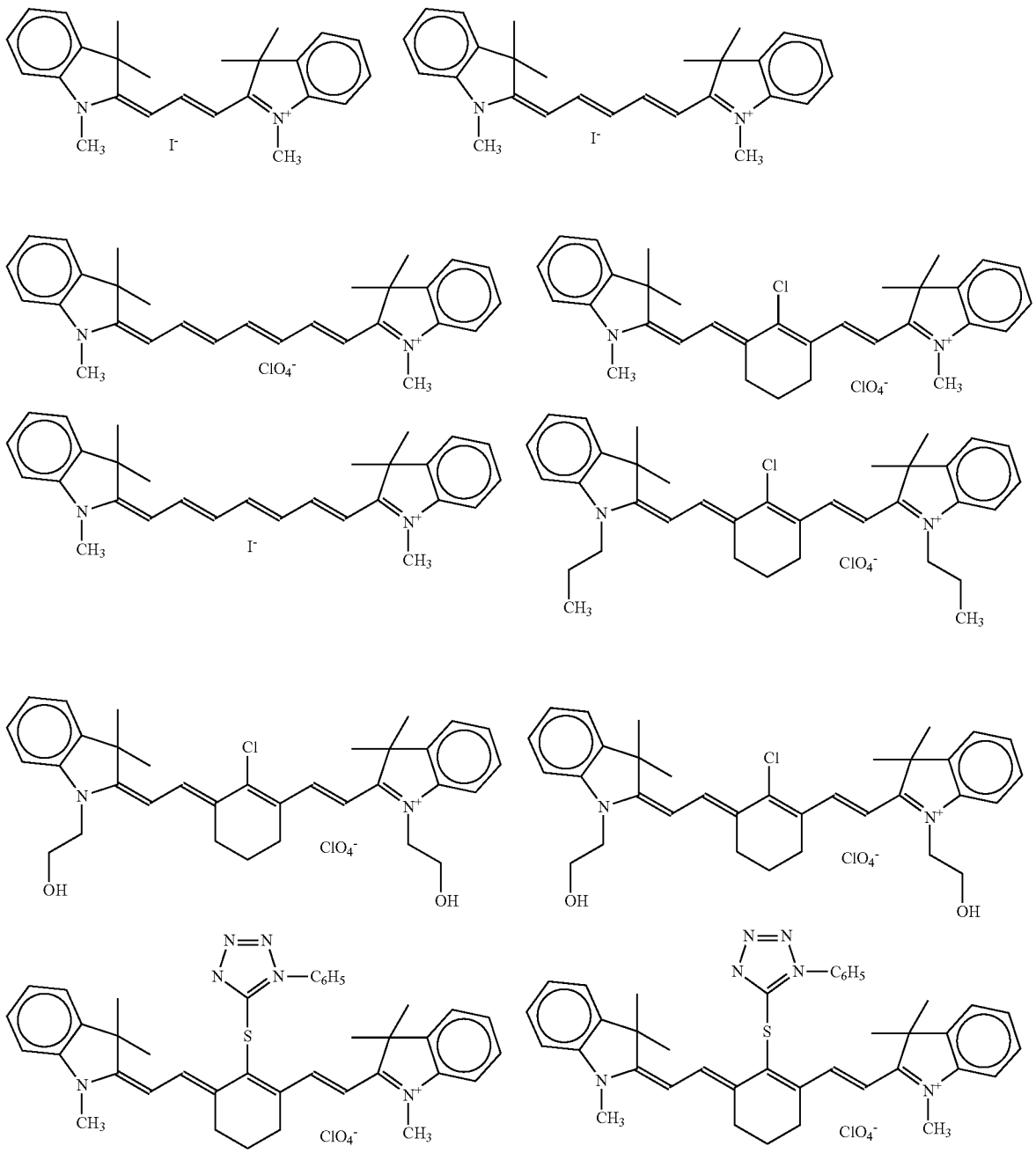

-continued
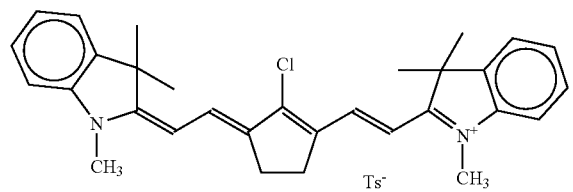
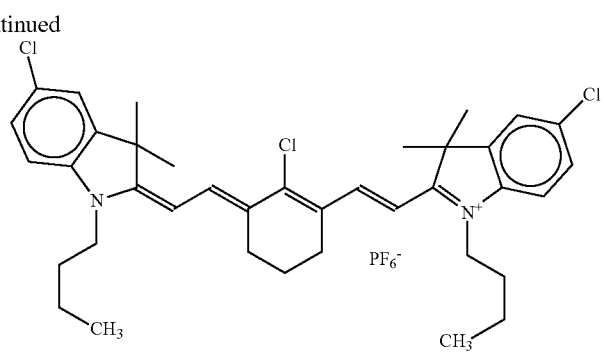
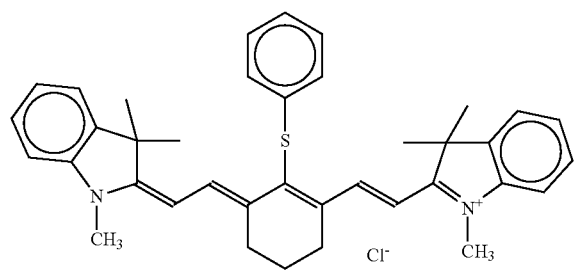
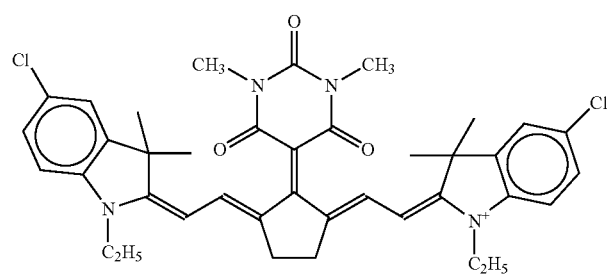
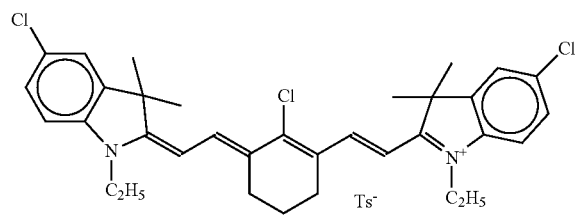
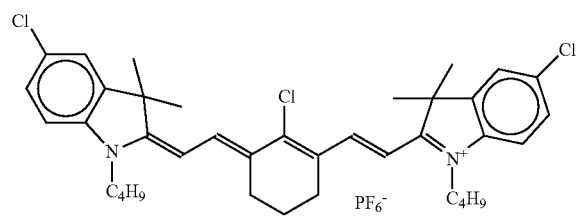
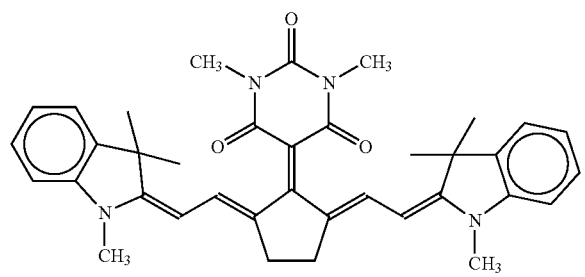
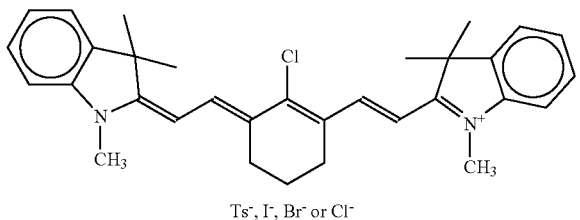
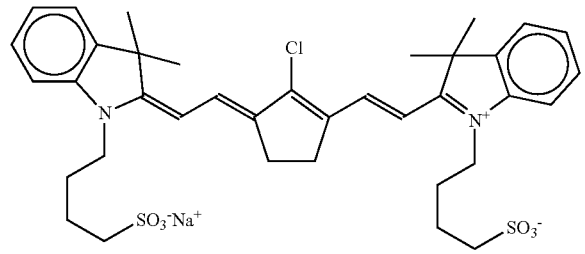
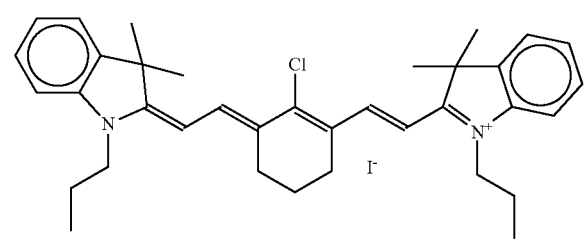
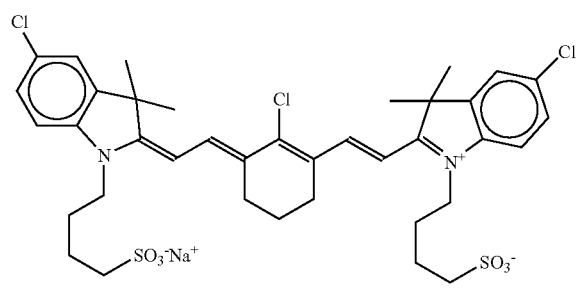
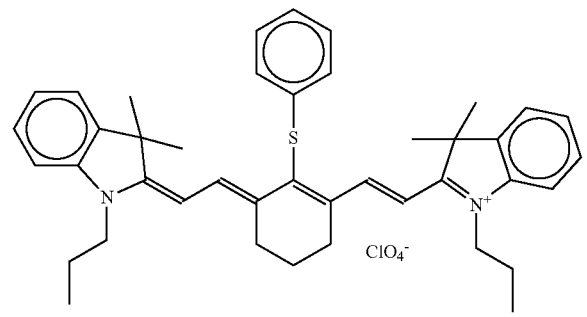

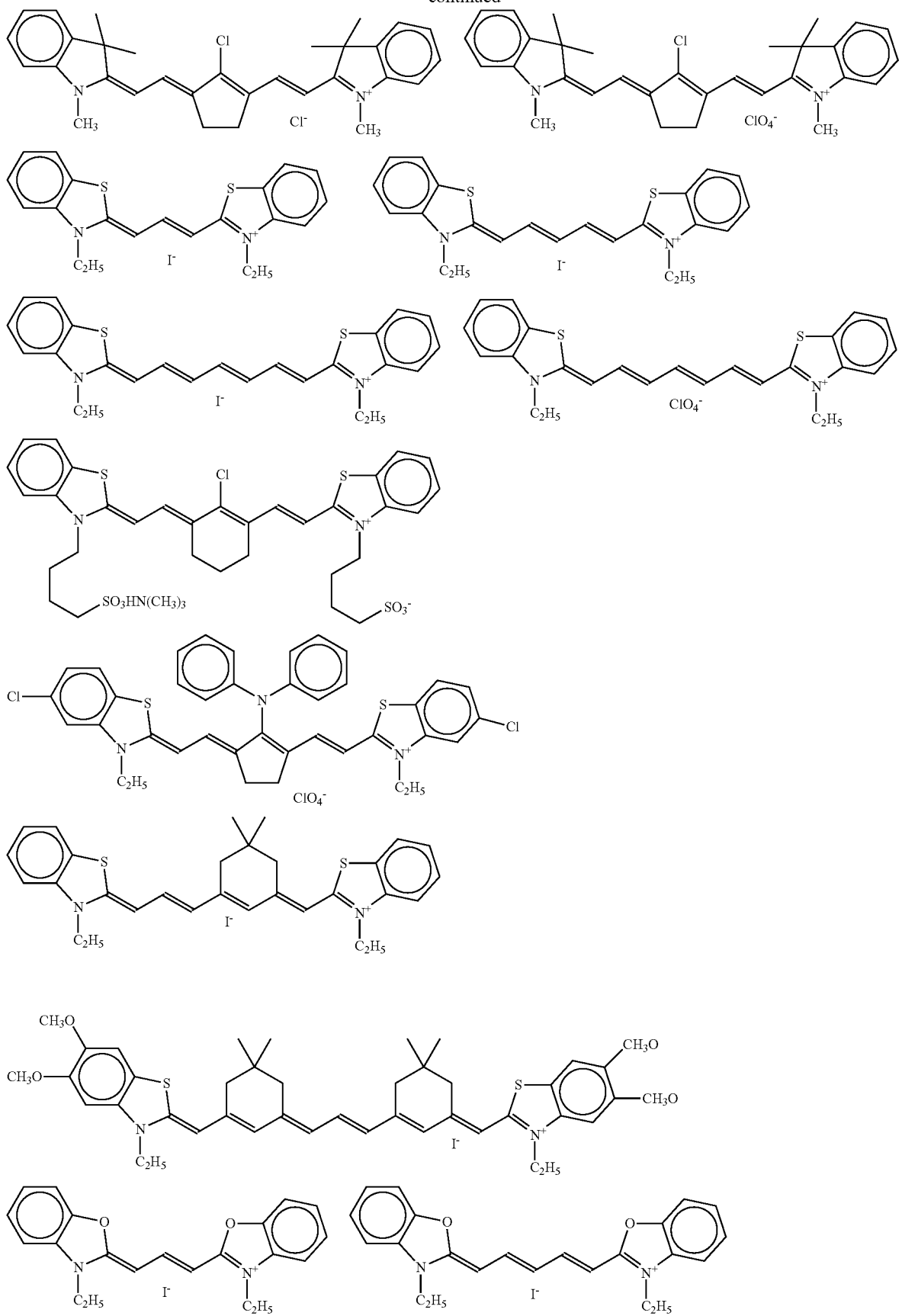

-continued
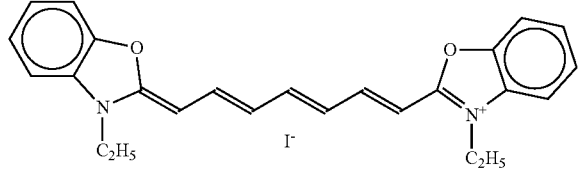
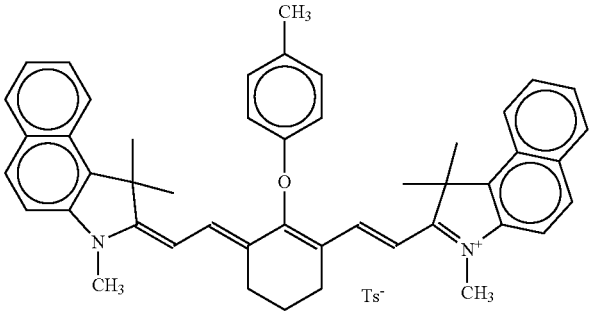
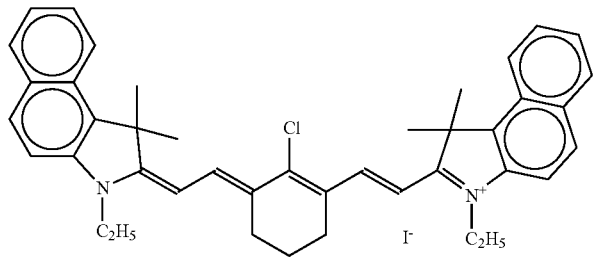
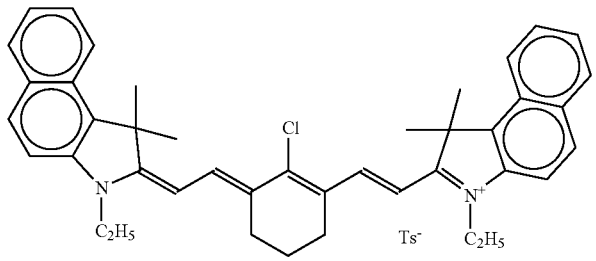
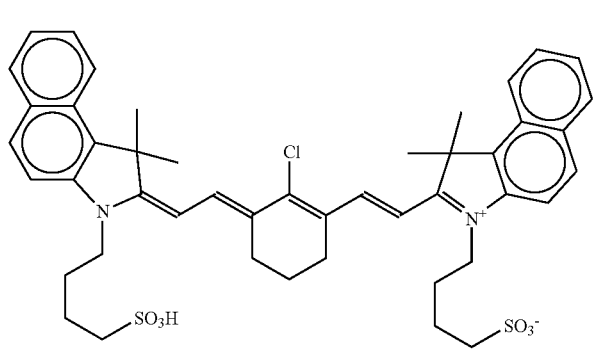
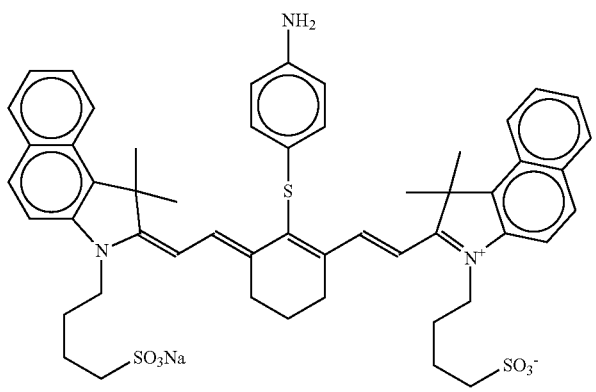
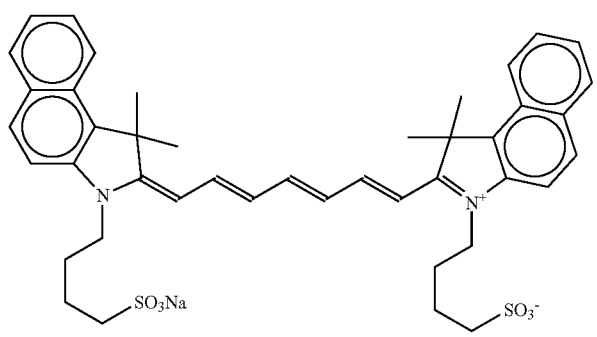
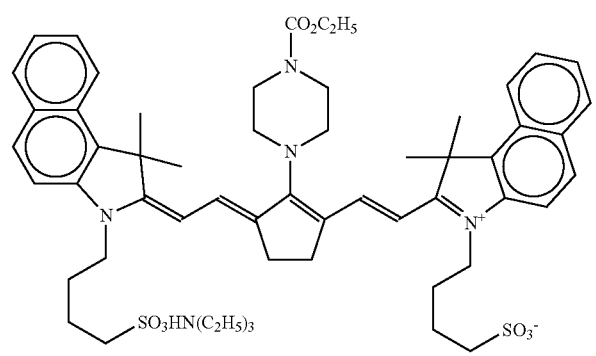
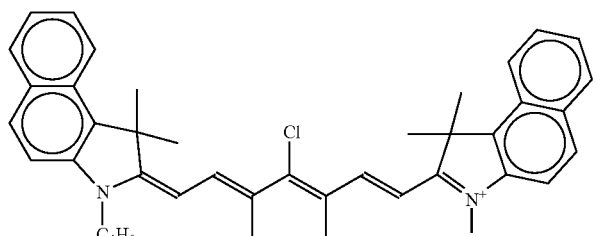
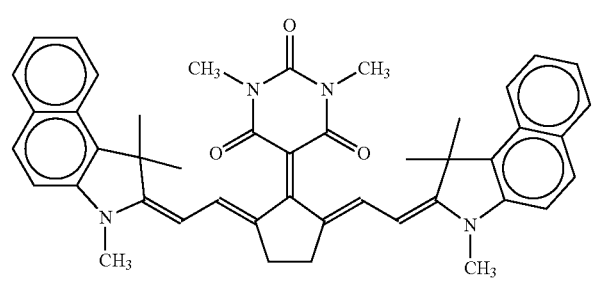

-continued
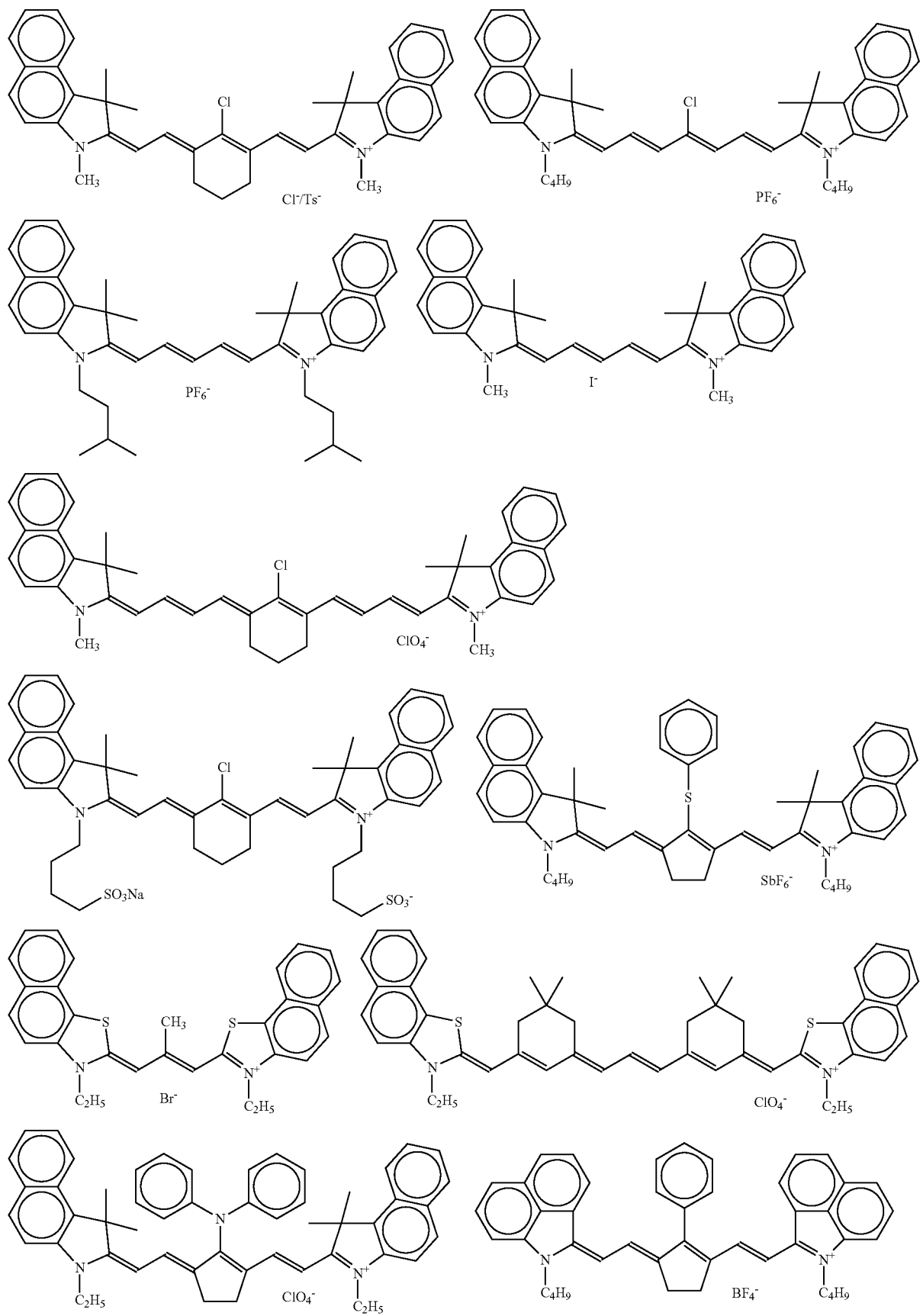

-continued
| 21 | 22 |
|---|---|
| 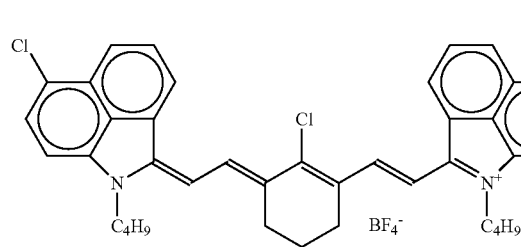 | 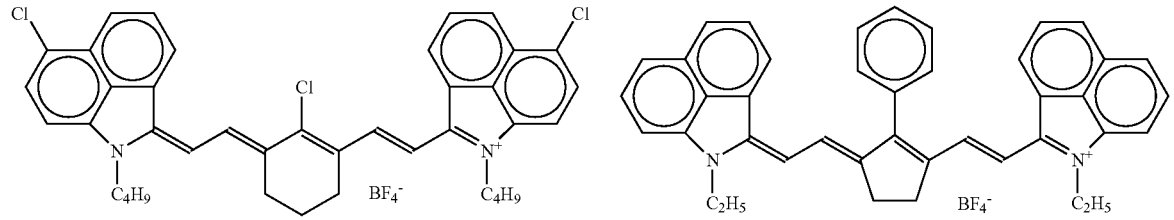 |
| 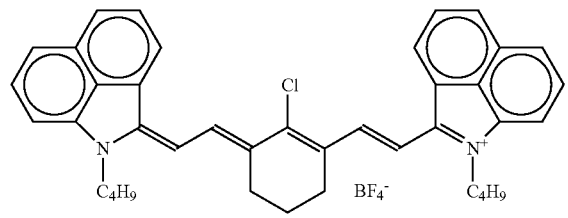 | 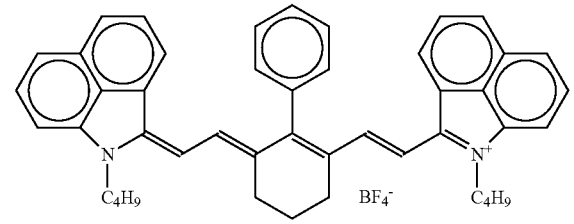 |
| 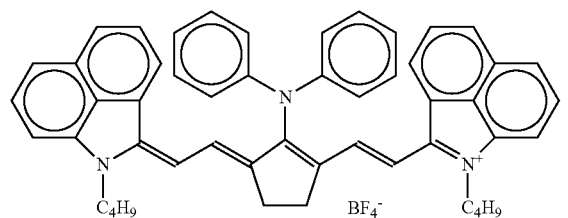 | 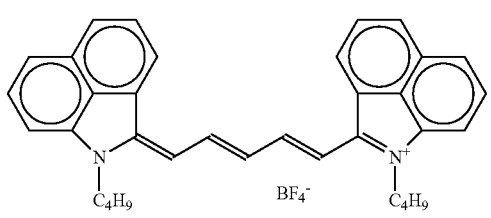 |
| 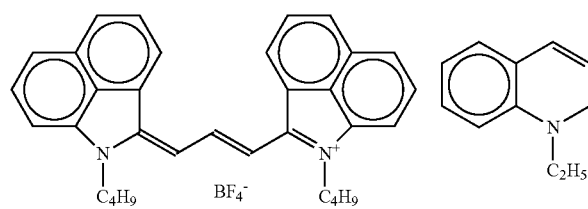 | 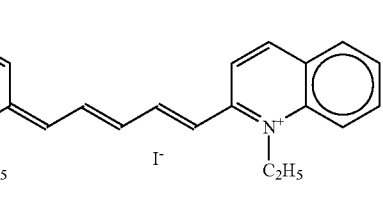 |
| 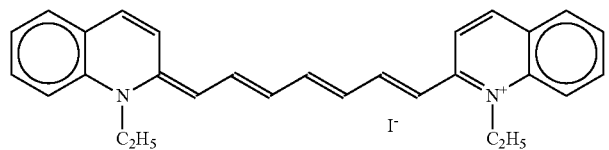 | |
| 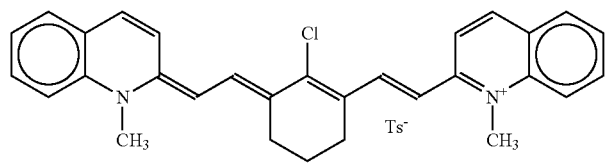 | |
| 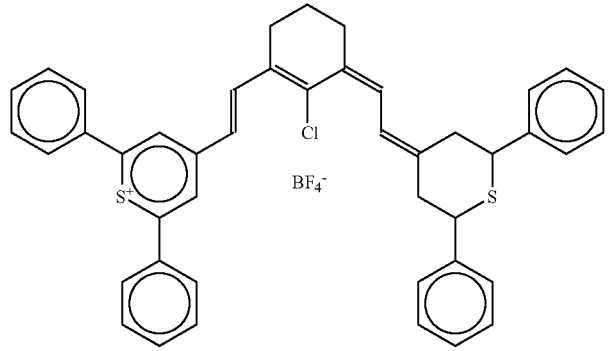 | 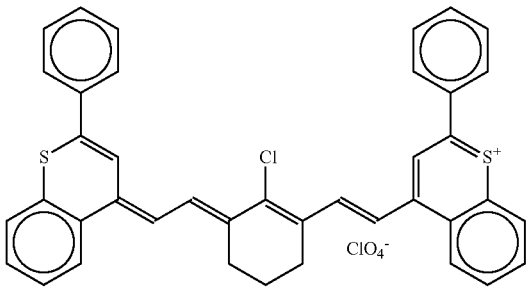 |

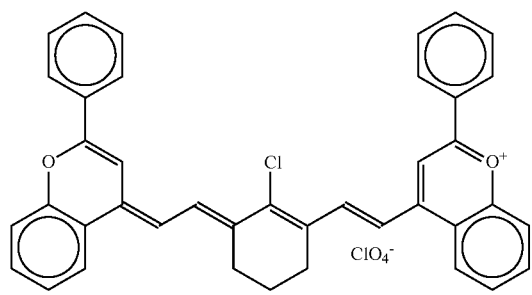

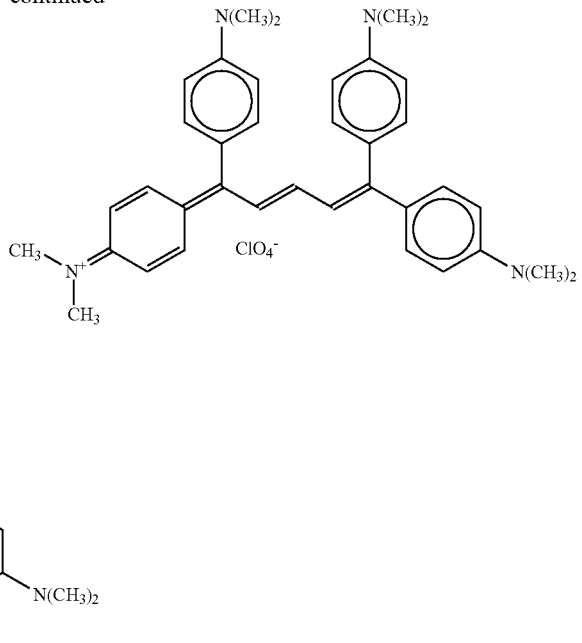

The dyes described herein can be prepared by any of the procedures known in the art, e.g., as described in N. Narayan et al., *J. Org. Chem.*, 1995, 60, 2391-2395, the contents of which are incorporated by reference herein in its entirety.

The one or more crosslinkable polymers can be any of the polymers known in the art which can be crosslinked by any of the numerous means known in the art (e.g., by chemical, thermal, and/or radiative curing methods). The polymers can be homopolymers, copolymers, terpolymers, or higher order polymers. The crosslinkable polymers are preferably suitable for forming a solid sacrificial or protective layer (particularly, a thin film) on a microelectronic substrate. Some classes of such polymers include polymer compositions typically used in anti-reflective coatings (and particularly BARC layers), SITH-based polymers and ROMP polymer systems. The crosslinkable polymers are also preferably not adversely reactive with the dyes contemplated herein.

In one embodiment, at least one of the one or more crosslinkable polymers contains reactive cyclic ether groups, such as oxacyclobutyl or epoxide groups (i.e., ethylene oxide ring moieties) for at least a portion of the polymeric units. In another embodiment, at least one of the one or more crosslinkable polymers contains one or more types of acrylate or methacrylate units for at least a portion of the polymeric units. The acrylate or methacrylate can be either in the acid or ester form, wherein the ester form can be an ester of any of the hydrocarbon groups (optionally heteroatom-substituted) described above. The one or more acrylate or methacrylate units contemplated herein can be conveniently expressed by the formulae:

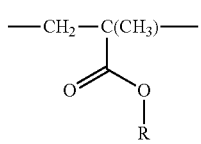 (14)

-continued

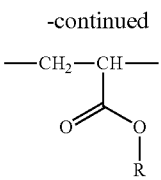 (15)

In formulae 14 and 15, R represents any of the hydrocarbon groups described above, optionally heteroatom-derivatized with one or more O, N, or S atoms. In a particular embodiment, at least one of the acrylate or methacrylate units in the polymer possesses R as a reactive cyclic ether (e.g., epoxide) group. In another embodiment, at least one of the acrylate or methacrylate units in the polymer contains a monocyclic ring or polycyclic ring system, either of which may be saturated or unsaturated, or aliphatic or aromatic.

In another embodiment, at least one of the one or more crosslinkable polymers contains polymerized vinyl hydrocarbon units for at least a portion of the polymeric units (e.g., polypropylene, polystyrene, and the like). The one or more vinyl hydrocarbon units contemplated herein can be conveniently expressed by the formulae:

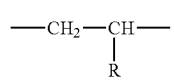 (16)

In formula 16, R represents any of the hydrocarbon groups described above, optionally heteroatom-derivatized with one or more O, N, or S atoms. In a particular embodiment, at least one of the vinyl hydrocarbon units in the polymer possesses R as a reactive cyclic ether (e.g., epoxide) group. In another embodiment, at least one of the vinyl hydrocarbon units in the polymer contains a monocyclic ring or polycyclic ring system, either of which may be saturated or unsaturated, or aliphatic or aromatic.

Some particularly preferred polymeric units include the following:

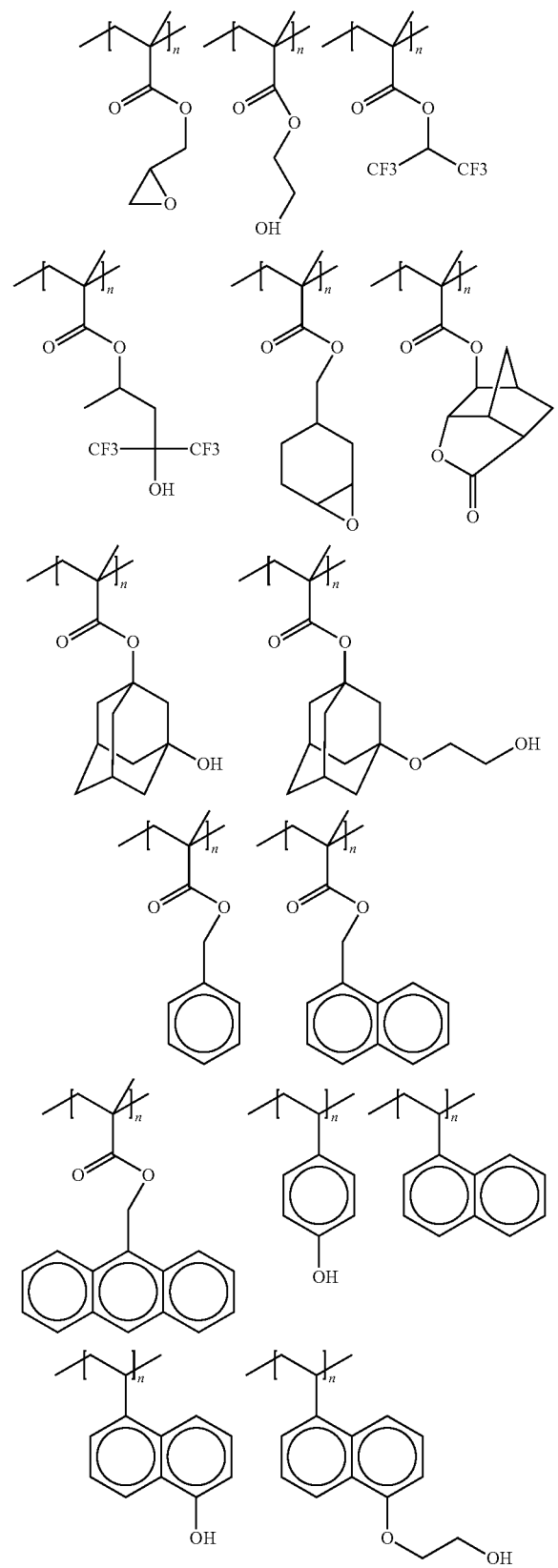

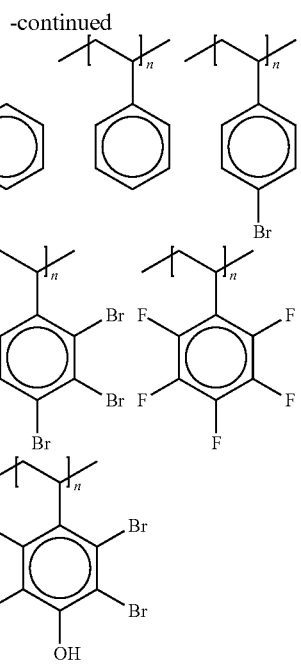

The collection of chemical structures given above can indicate individual polymeric units (i.e., where n is a value of at least 1) which can be combined with other polymeric units, and particularly other polymeric units given in the collection of chemical structures above. In one embodiment, the polymers are homopolymers of any of the polymeric units given above. In another embodiment, the polymers are copolymers of any of the polymeric units exemplified above. In another embodiment the polymers are terpolymers or higher-order polymers of any of the polymeric units exemplified above. The copolymers, terpolymers, and higher order polymers can be, for example, block copolymers, graft copolymers, or random copolymers. A combination (i.e., mixture) of polymers, copolymers, terpolymers, as well as combinations amongst these, are also contemplated.

Some particularly preferred crosslinkable copolymers include those of the following chemical structures:

(17)

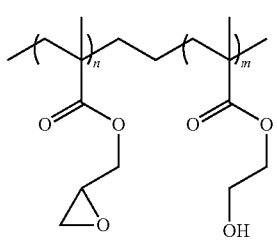

(18)

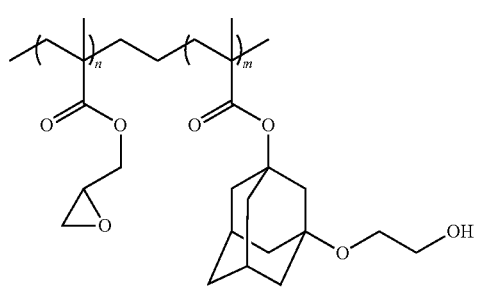

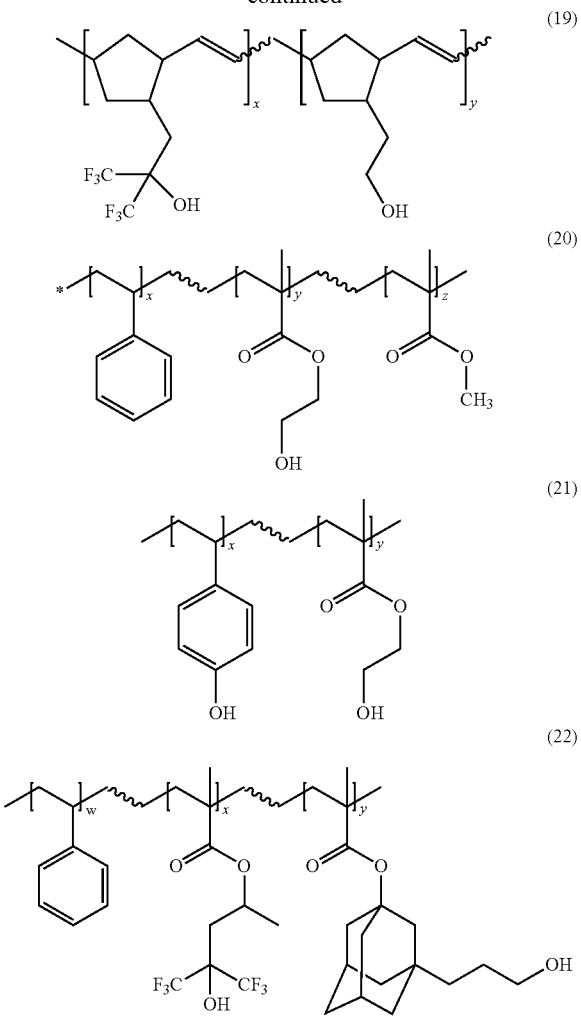

In chemical formulae 17-22 above, subscripts n, m, w, x, y, and z are each independently at least 1, 2, 3, or 4 and up to, for example, 10, 50, 100, 500, 1000, or higher. Alternatively, these subscripts can be taken as molar percentages, such that, for example, n+m=100. In this mode, either norm can be, for example, 1, 2, 5, 10, 15, 20, 25, 30, 35, 40, 45, or 50 molar percent, or a range therebetween.

The one or more casting solvents are any solvents known in the art which effectively solubilize the dye. The solvent may be any solvent conventionally used with spin coat methods, and which does not have a substantial negative impact on the performance of the NIR absorbing layer composition. Some examples of solvents include 3-pentanone, Methyl Isobutyl Ketone (MIBK), Propylene glycol methyl ether (1-Methoxy-2-propanol), Methyl Cellosolve (2-Methoxyethanol), Butyl Acetate, 2-ethoxyethanol, Propylene glycol methyl ether acetate (PGMEA), Propylene glycol propyl ether (1-Propoxy-2-propanol, Dowanol PnP), 4-heptanone, 3-heptanone, 2-heptanone, N,N-dimethylformamide, Anisole, Ethyl Lactate, Cyclohexanone, Cellosolve Acetate (Ethylene glycol ethyl ether acetate), N,N-dimethylacetamide, Diglyme (2-methoxy ethyl ether), Ethyl 3-ethoxy propionate, Dimethyl Sulfoxide, Di (propylene glycol) methyl ether (DOWANOL), Di (ethylene glycol) methyl ether, Diethylmalonate, 2-(2-butoxy ethoxy ethanol) (DEGBE) and gamma-butyrolactone.

The amount of solvent in the composition for application to a substrate is typically selected such that a solids content of about 1-20 wt. % is achieved. Higher solids content formulations will generally yield thicker coating layers. The compositions of the present disclosure may further contain minor amounts of auxiliary components (e.g., base additives, surfactants, etc.) as may be known in the art.

The liquid formulation can optionally contain one or more inter-polymer crosslinking agents (i.e., "crosslinking component") for facilitating the hardening (curing) step. The one or more inter-polymer crosslinking agents are any molecules or polymers which function by interlinking functional groups of different polymer chains. For example, a diol, triol, tetrol or higher polyol compound or polymer is effective for crosslinking of epoxidized polymers, or alternatively, a di-epoxy, tri-epoxy, or poly-epoxy compound or polymer is effective for crosslinking of hydroxy-, amino-, or epoxy-containing polymers. The crosslinking component is typically a crosslinker that can be reacted with all the polymer components present in the antireflective coating composition in a manner which is catalyzed by generated acid and/or by heating. Generally, the crosslinking component used in the antireflective coating compositions of the invention is any suitable crosslinking agent known in the negative photoresist art which is otherwise compatible with the other selected components of the composition. The crosslinking agents typically act to crosslink the polymer component in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDERLINK® trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example, methylated or butylated melamine resins (N-methoxymethyl- or N-butoxymethyl-melamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of crosslinking agents may be preferred in some embodiments.

Some particular examples of inter-polymer crosslinking agents are given as follows:

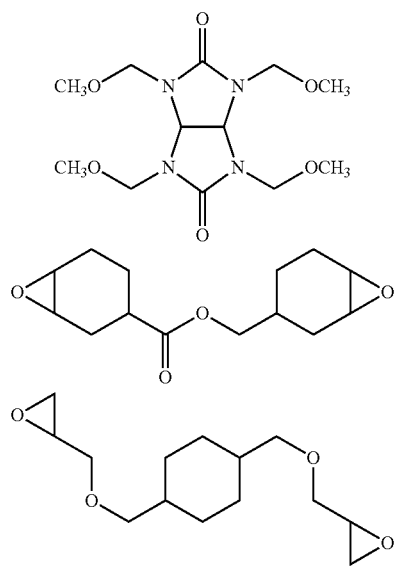

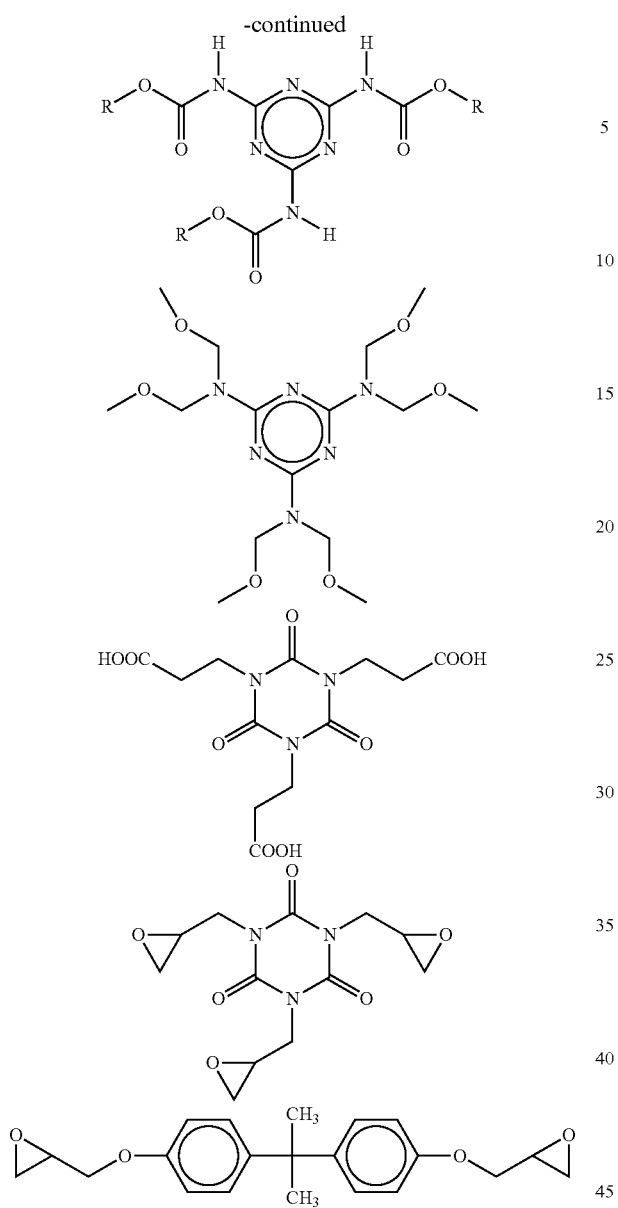

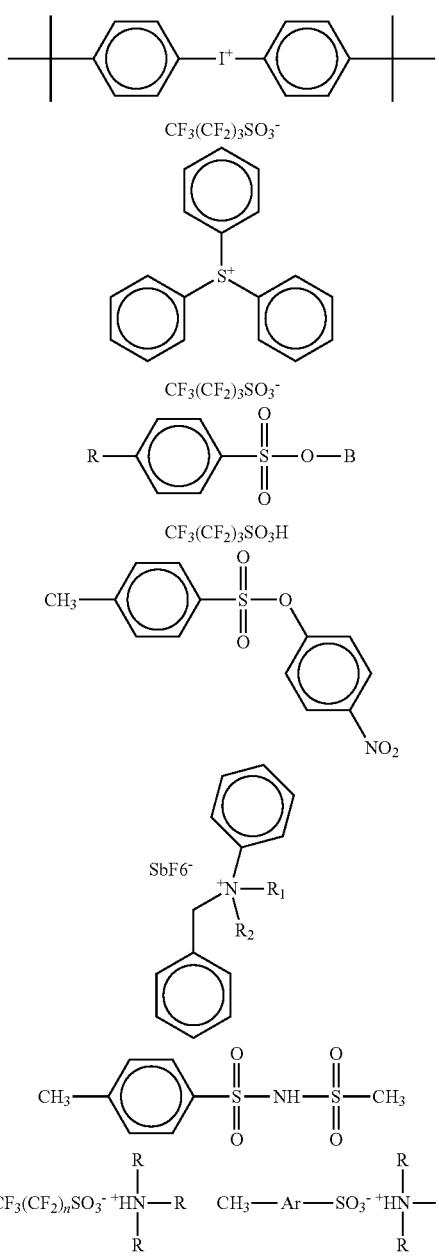

The liquid formulation can optionally contain one or more acid generators for facilitating the hardening (curing) step. The acid generator is typically a thermal acid generator compound that liberates acid upon thermal treatment. Some examples of thermal acid generators include 2,4,4,6-tetrabromocyclohexadienone, benzoin tosylate, 2-nitrophenyl tosylate, and other alkyl esters of organic sulfonic acids. Compounds that generate a sulfonic acid group upon activation are generally suitable. Other suitable thermally activated acid generators are described in U.S. Pat. Nos. 5,886,102 and 5,939,236. If desired, a radiation-sensitive acid generator may be employed as an alternative to a thermally activated acid generator or in combination with a thermally activated acid generator. Examples of suitable radiation-sensitive acid generators are also described in U.S. Pat. Nos. 5,886,102 and 5,939,236. Other radiation-sensitive acid generators known in the resist art may also be used as long as they are compatible with the other components of the NIR absorbing composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line). In some embodiments it is preferable to use mixtures of acid generators.

Some particular examples of thermal acid generators are given as follows:

The liquid formulation can optionally contain one or more surfactants. The surfactants can be included to, for example, provide the NIR absorbing film with improved film thickness uniformity across the wafer by acting as leveling agents. When used as wetting agents, surfactants can also reduce defect formation arising from inadequate substrate surface wetting during the spin coating of the NIR absorbing film.

In one embodiment, the one or more surfactants includes an ionic surfactant, which can be either an anionic, cationic, or zwitterionic surfactant. Some examples of anionic surfactants include the fluorinated and non-fluorinated carboxylates (e.g., perfluorooctanoates, perfluorodecanoates, perfluorotetradecanoates, octanoates, decanoates, tetradecanoates, fatty acid salts), the fluorinated and non-fluorinated sulfonates (e.g., perfluorooctanesulfonates, perfluorodecanesulfonates, octanesulfonates, decanesulfonates, alkyl benzene sulfonate), the fluorinated and non-fluorinated sulfate salts (e.g., dodecyl sulfates, lauryl sulfates, sodium lauryl ether sulfate, perfluorododecyl sulfate, and other alkyl and perfluoroalkyl sulfate salts). The majority of cationic surfactants contain a positively charged nitrogen atom, such as found in the quaternary ammonium surfactants, e.g., the alkyltrimethylammonium salts wherein the alkyl group typically possesses at least four carbon atoms and up to 14, 16, 18, 20, 22, 24, or 26 carbon atoms. Some examples of cationic surfactants include the quaternary ammonium surfactants (e.g., cetyl trimethylammonium bromide, benzalkonium chloride, and benzethonium chloride), the pyridinium surfactants (e.g., cetylpyridinium chloride), and the polyethoxylated amine surfactants (e.g., polyethoxylated tallow amine). Some examples of zwitterionic surfactants include the betaines (e.g., dodecyl betaine, cocamidopropyl betaine) and the glycinates. Some examples of non-ionic surfactants include the alkyl polyethyleneoxides, alkylphenol polyethyleneoxides, copolymers of polyethyleneoxide and polypropyleneoxide (e.g., poloxamers and poloxamines), alkyl polyglucosides (e.g., octyl glucoside, decyl maltoside), fatty alcohols, (e.g., cetyl alcohol, oleyl alcohol), fatty amides (e.g., cocamide MEA, cocamide DEA), and polysorbates (e.g., polysorbate 20, polysorbate 40, polysorbate 60, polysorbate 80).

In one embodiment, the one or more crosslinkable polymers are chemically distinct from (i.e., not bound to) the one or more near-infrared absorbing polymethine dyes. In another embodiment, at least a portion of the one or more crosslinkable polymers are chemically part of one or more of the dyes. For example, any of the polymethine dyes described above may be covalently bound to one or more polymeric units of one or more crosslinkable polymers, such that at least a portion of the crosslinkable polymers remain crosslinkable.

Likewise, in one embodiment, one or more crosslinking agents are included, which are chemically distinct from (i.e., not bound to) the one or more near-infrared absorbing polymethine dyes. In another embodiment, one or more crosslinking groups are included as a functional group (for example, an epoxy-containing or hydroxy-containing group) covalently bound to the dye. Significantly, when one or more crosslinking groups are included as a functional group of the dye, it is possible, by use of curing methods known in the art, for the dye molecules to become crosslinked and form a solid near-infrared absorbing film in the absence of one or more crosslinkable polymers. However, in particular embodiments, it can be advantageous to include dye molecules containing crosslinkable groups in addition to crosslinkable polymers in forming a solid near-infrared absorbing film. In this manner, crosslinking can take place between dye molecules and a crosslinkable polymer, and/or between crosslinkable polymer strands, and/or between dye molecules.

The liquid formulation described above undergoes a crosslinking step by any of the numerous means known in the art (e.g., by chemical, thermal, and/or radiative curing methods) in order to produce a solid near-infrared absorbing film. Generally, substantially all of the casting solvent is removed during the curing process. The film can have any suitable thickness. The thickness of the film is generally limited by the application space. In different embodiments, the film has a thickness of at least, or at most, 1 nm, 10 nm, 20 nm, 30 nm, 40 nm, 50 nm, 100 nm, 250 nm, 400 nm, 500 nm, 750 nm, 1 µm, 2 µm, 5 µm, 10 µm, 50 µm, or 100 µm, or any particular range of thicknesses bounded by any two of the foregoing values. In a preferred embodiment, the NIR-absorbing film has a thickness no more than, and preferably, less than, 1000 nm. A particularly preferred film thickness is in the range of 30-400 nm. The NIR-absorbing film preferably has a k value greater than 0.15 at its absorption maximum within a 600-1200 nm range. The NIR-absorbing film more preferably has a k value greater than 0.45, and even more preferably, greater than 0.7 in this range.

Particularly contemplated herein is a microelectronic (i.e., semiconductor) substrate having on its surface the near-infrared absorbing film described above. The NIR-absorbing film can be coated onto the microelectronic substrate (or other surface) by any of the techniques known in the art for this purpose. In a particular embodiment, the NIR-absorbing film is applied by a solvent casting method and cured. It is desirable to have the NIR-absorbing film absorb a significant portion (such as, at least 30%) or substantial portion (preferably, at least 50%, 60%, 70%, 80%, or 90%) of the NIR light of the leveling signal passing through the film stack as reflected from the substructures. A greater absorption of the reflected light can be achieved, if desired, by coating a thicker NIR-absorbing film or engineering the NIR-absorbing film to have a relatively higher k value through a broad range of NIR spectrum.

In a particular embodiment, a microelectronic substrate covered by the NIR-absorbing film, as described above, further contains a resist (e.g., photoresist) film covering the NIR-absorbing film (i.e., the NIR-absorbing film is between the microelectronic substrate and photoresist film). The photoresist film can be any of the positive or negative photoresist films known in the art. In one embodiment, the resist directly covers the NIR-absorbing film (i.e., the resist is bonded to or in contact with the NIR-absorbing film). In another embodiment, the resist does not directly cover (i.e., the resist is not bonded to or in contact with) the NIR-absorbing film by having one or more other films between the resist and NIR-absorbing film. For example, any one or more layers of other coatings may also be present between the microelectronic substrate and NIR-absorbing film or between the NIR-absorbing film and photoresist. In another embodiment, the NIR-absorbing film described above includes a photoimageable component such that the NIR-absorbing film is also a photoresist film.

In addition, one or more other films can cover the resist layer. An example of a type of film used for covering the resist layer is an immersion top coat film. An immersion top coat film typically functions to prevent resist components from leaching into an immersion medium, such as water.

To provide a proper vertical alignment, the focus leveling sensor light is emitted from a broad band NIR source, and this impinges upon, and is reflected from, the microelectronic structure. The reflected light is then detected by a leveling photosensor followed by an auto focus mechanism which adjusts the z height to place the photoresist layer within the imaging focal plane. Any NIR light reflected from substructures will interfere with the surface reflected light and cause a wrong adjustment in z height. The incorporation of the NIR-absorbing film, as described herein, advantageously substantially minimizes or even removes reflected or diffracted infrared wavelengths emanating from buried topography of the underlying microelectronic substrate. Accordingly, a much more accurate sensing of the top wafer surface is made possible. The improved sensing of the top surface allows for a more accurate placement of surface features or surface operations (e.g., patterning of a photoresist).

In the microelectronic structure, the solid near-infrared absorbing film typically functions as an anti-reflective coating, such as a bottom anti-reflective (BARC) coating, a planarization underlayer (UL), or an extra interlayer. Since both BARC and UL layers usually require significant absorption at the imaging wavelength and/or etch resistance toward oxygen containing plasma, it is preferable to have an aromatic and/or polycyclic moiety in the crosslinkable polymer described above.

In another aspect, the invention is directed to a method for patterning a photoresist layer coated on a microelectronic substrate having the above NIR-absorbing film between the microelectronic substrate and photoresist film. The NIR-absorbing layer provides sufficient absorption of the NIR light passing through it. The method includes aligning and focusing a focal plane position of the photoresist film by sensing near-infrared emissions reflected from the microelectronic structure and adjusting relative positions of an exposure device and microelectronic substrate based on sensed emissions. After the photoresist film has been aligned and adjusted, the photoresist layer is patterned by being exposed to a patterning exposure beam. The method can also include numerous other steps commonly employed in the art of microelectronic or semiconductor processing. For example, after patterning of the photoresist, the photoresist is typically developed by any of the methods known in the art.

Examples have been set forth below for the purpose of illustration and to describe certain specific embodiments of the invention. However, the scope of this invention is not to be in any way limited by the examples set forth herein.

Example 1

Formulation of NIR Absorbing Casting Solution

NIR absorbing dye Epolight 5547 (obtained from Epolin Inc., Newark N.J.) and poly(3,4-epoxycyclohexylmethyl methacrylate) (PEPCHMMA) polymer were dissolved in a cyclohexanone/gamma butyrolactone solvent mixture (70:30) in individual concentrations of 50 parts by weight each (2.0% by weight each with respect to the solvent mixture). A thermal acid generator consisting of triethylammonium nonafluorobutane sulfonate was added in a concentration of 5 parts by weight are added to the solution, achieving 4.2 wt. % by weight of total solids. The formulated casting solution was filtered through a PTFE membrane (0.2 μm pore size).

Example 2

Film Formation

The formulation prepared as described in Example 1 was spin coated onto a 200 mm silicon wafer at 1500 rpm for 60 sec. The spin cast film was cured in two steps. The first bake step was conducted at 110° C. for 60 sec, after which the wafers were allowed to cool down to room temperature on a chill plate. The second bake step was conducted at 185° C. for 60 sec., after which the wafers were allowed to cool down to room temperature on a chill plate again. The film thickness was about 900 Å.

Example 3

Optical Properties of NIR Absorbing Layer

The optical constants (the index of refraction n and the extinction coefficient k) of the NIR absorbing film formed as described in Example 2 were measured in a radiation wavelength range between 400 nm and 1200 nm using a Variable Angle Spectroscopic Ellipsometer (VASE) manufactured by J. A. Woollam, Inc. The absorption maximum was located at a wavelength of 950 nm, with a $k^{max}=0.80$, as shown in FIG. 1.

Example 4

NIR Radiation Attenuation by Use of NIR Absorbing Film Layer

Figure 2:
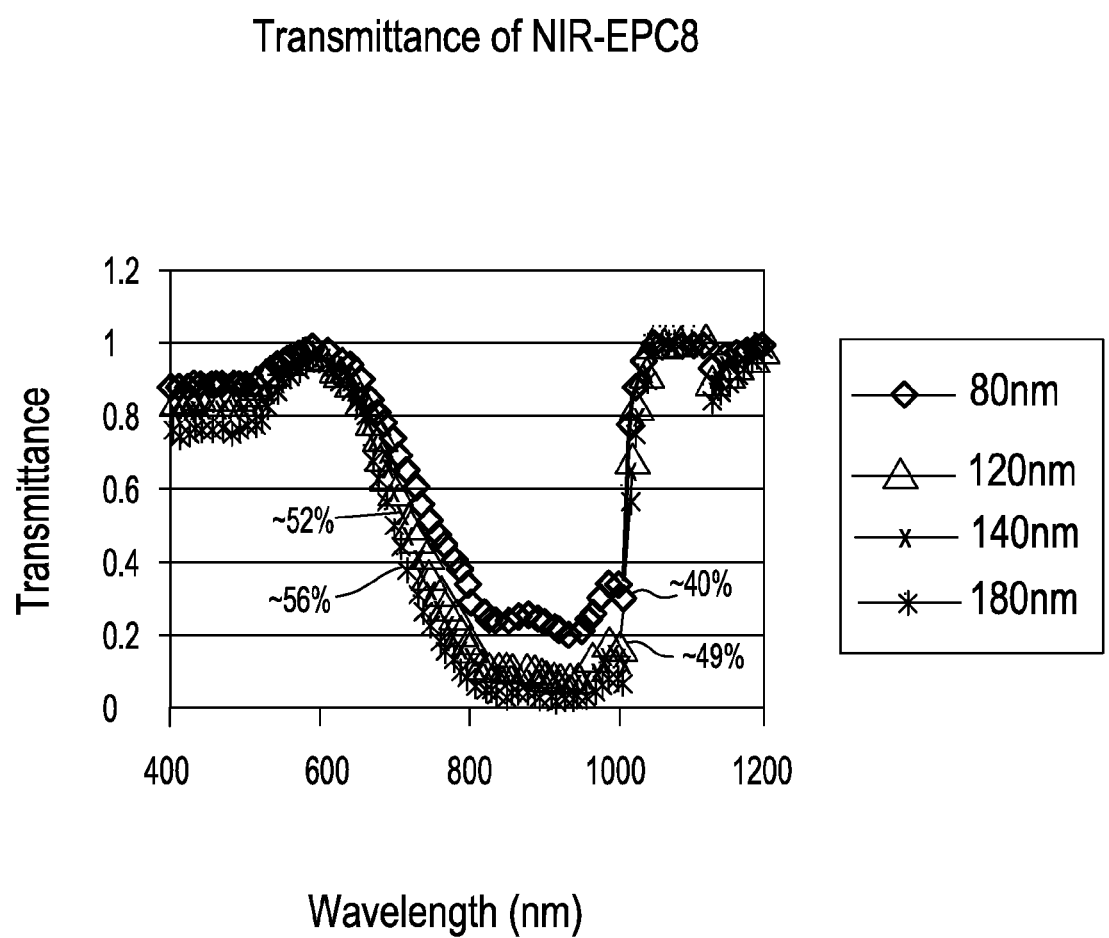
FIG. 2 is a graph showing transmittance properties of a rear-IR absorbing layer of the invention.
Figure 3A:
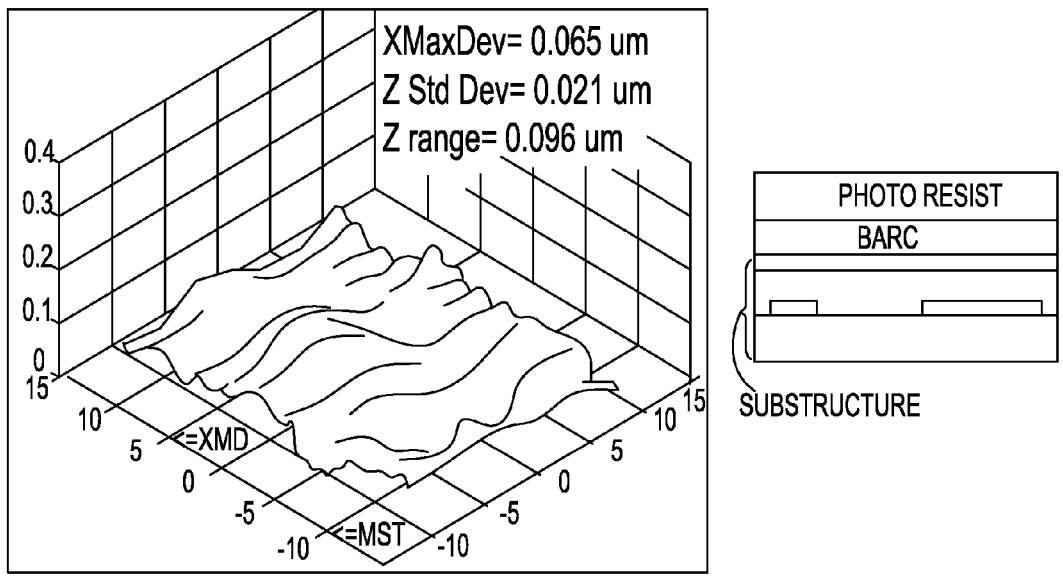
FIG. 3 is a comparison of the across-chip leveling sensor signal for the cases of a) conventional multilayer imaging stack; b) multilayer imaging stack including NIR absorbing underlayer.
Figure 3B:
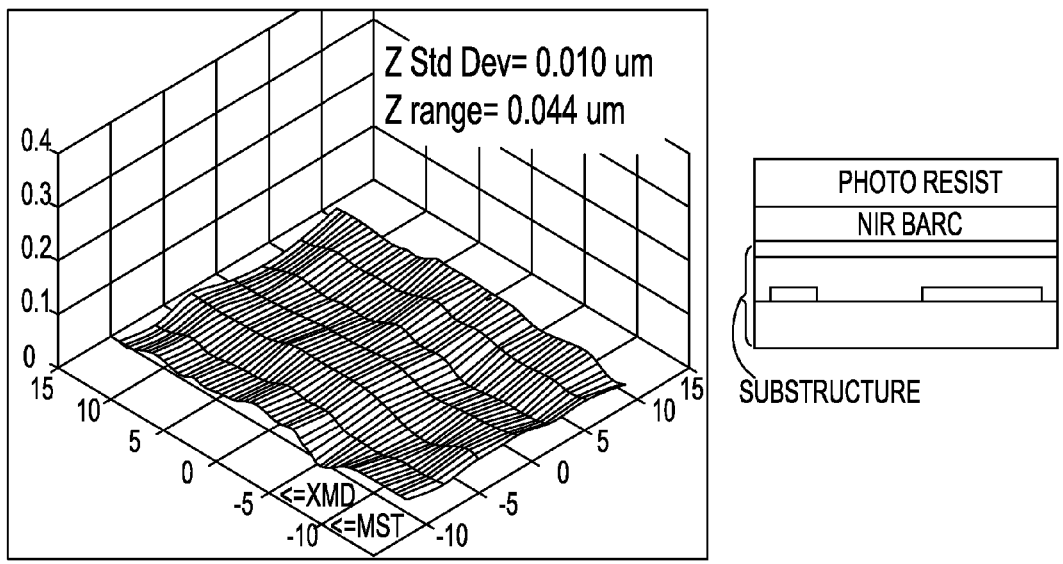

The optical properties of the NIR absorbing film from Example 3 were used to calculate the extent of NIR light attenuation for the case of normally incident radiation. The optical path x corresponds to twice the thickness of the NIR absorbing film, as the NIR radiation is not only absorbed but also internally reflected in the NIR absorbing layer. The relationship between transmitted light intensity (It), incident radiation (I0), extinction coefficient (k) and wavelength (λ) is given by $It=I0 \exp[-4\pi k x/\lambda]$. The wavelength range in the NIR region within which light attenuation is required for focus control improvement was located between 600-1200 nm. Therefore, it is possible to calculate the extent of light attenuation achieved for a given film thickness within this range by integrating the area above the different curves up to a transmission equal to 1. The extent of light attenuation achievable with the NIR absorbing film of the present example within this range is shown in FIG. 2. In order to achieve a total attenuation above 50% of the incident NIR radiation it was found preferable to coat NIR absorbing films of the disclosed composition in a thickness of at least 140 nm.

Example 5

Organic Solvent Resistance of NIR Absorbing Layer

The NIR absorbing layer formed as described in Example 2 was rinsed with propylene glycol methyl ether acetate (PGMEA) for 10 seconds and spin-dried. The n and k constants of the solvent-rinsed NIR absorbing film were measured in a radiation wavelength range between 400 nm and 1200 nm using a Variable Angle Spectroscopic Ellipsometer (VASE). The absorption maximum after PGMEA rinsing was located at a wavelength of 950 nm, with a $k^{max}=0.79$.

The above procedure was repeated on the PGMEA-rinsed NIR absorbing film, this time using cyclohexanone as a rinse solvent. The new absorption maximum after cyclohexanone rinsing was located at a wavelength of 950 nm, with a $k^{max}=0.79$.

The above procedure was repeated on the cyclohexanone-rinsed NIR absorbing film, this time using VT7000 organic solvent mixture (butyl acetate/gamma-butyrolactone 70:30)

as a rinse liquid. The new absorption maximum after VT7000 rinse was located at a wavelength of 950 nm, with a $k^{max}$=0.73.

Example 6

Focus Control Improvement by Use of NIR Absorbing Film Layer

A control wafer consisting on a product wafer containing buried metal layers of variable density across the individual chips was coated with a 193 nm BARC and 193 nm photoresist layers. The metal density variability across the chip was detected by the NIR leveling system of the 193 nm optical scanner as apparent height variations, despite the fact that the actual surface topography was largely flat.

A second wafer with identical embedded topography was coated with the NIR absorbing layer of Example 2 and a 193 nm photoresist layer. In this case, the NIR leveling system detected a much flatter surface that was closer to the actual wafer surface due to the blocking effect of the NIR absorbing layer, which prevented the NIR radiation from reaching the underlying reflective metal layers.

Example 7

Synthesis of copolymer of 3-(2-hydroxyethoxy)-1-adamantyl methacrylate and glycidyl methacrylate (PHEADMAGCMA (20/80))

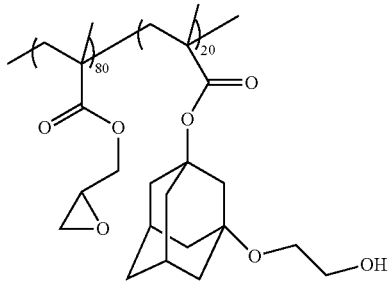

To a round bottom flask equipped with condenser, thermometer, an argon inlet and a magnetic stirrer bar, the following were added: 3-(2-hydroxyethoxy)-1-adamantyl methacrylate (HEADMA) monomer (3.365 g, 0.012 mole), glycidyl methacrylate (GCMA) monomer (6.823 g, 0.048 mole), AIBN (0.394 g, 4% of total moles of monomers), and ~40 g of THF. The reaction mixture was stirred at room temperature and bubbled with argon (Ar) flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at 40° C. overnight. The molecular weight (MW) was determined to be about 23,050 g/mol as determined by gel permeation chromatography (GPC) using a Waters model 150-C in THF at 28° C. calibrated with polystyrene standards.

Example 8

Synthesis of copolymers of 3-(2-hydroxyethoxy)-1-adamantyl methacrylate and glycidyl methacrylate (PHEADMAGCMA (50/50)) and (PHEADMAGCMA (35/65))

The two copolymers were synthesized with the same procedure as described in Example 7. The amounts of the monomers used in the reaction are shown in Table 1 below:

TABLE 1

| Polymer | HEADMA | GCMA |
|---|---|---|
| PHEADMAGCMA(50/50) | 8.412 g (0.03 mole) | 4.265 g (0.03 mole) |
| PHEADMAGCMA(35/65) | 5.89 g (0.021 mole) | 5.54 g (0.039 mole) |

The molecular weights, as determined by gel permeation chromatography (GPC) using a Waters model 150-C in THF at 28° C. calibrated with polystyrene standards, are shown in the following Table 2 below.

TABLE 2

| Sample | Polymer Composition | MW |
|---|---|---|
| 1 | PHEADMAGCMA(50/50) | 36,734 |
| 2 | PHEADMAGCMA(35/65) | 30,386 |

Example 9

Synthesis of copolymer of 5-methacryloyloxy-2,6-norbornanecarbo-gamma-lactone and glycidyl methacrylate (PNLMGCMA (35/65))

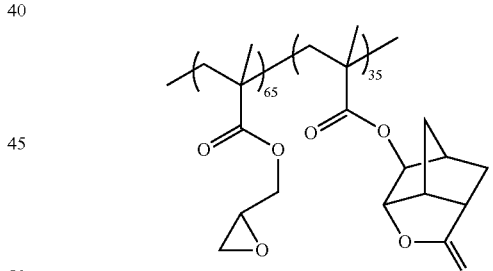

PNLMGCMA (35/65)

To a round bottom flask equipped with condenser, thermometer, an argon inlet and a magnetic stirrer bar, the following were added: 5-methacryloyloxy-2,6-norbornanecarbo-gamma-lactone (NLM) monomer (5.84 g, 0.0263 mole), glycidyl methacrylate (GCMA) monomer (6.93 g, 0.0488 mole), AIBN (0.492 g, 4% of total moles of monomers), and ~50 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at 40° C. overnight. The molecular weight (MW) was determined to be about 19,291 g/mol as determined by gel permeation chromatography (GPC) using a Waters model 150-C in THF at 28° C. calibrated with polystyrene standards.

Example 10

Synthesis of Homopolymer of Glycidyl Methacrylate (PGCMA)

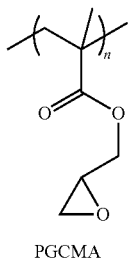

PGCMA

To a round bottom flask equipped with condenser, thermometer, an argon inlet and a magnetic stirrer bar, the following were added: glycidyl methacrylate (GCMA) monomer (11.372 g, 0.08 mole), AIBN (0.525 g, 4% of total moles of monomers), and ~40 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 18,768 g/mol as determined by gel permeation chromatography (GPC) using a Waters model 150-C in THF at 28° C. calibrated with polystyrene standards.

Example 11

Synthesis of Copolymer of 2-Hydroxyethyl Methacrylate and Glycidyl Methacrylate (PHEMAGCMA (35/65))

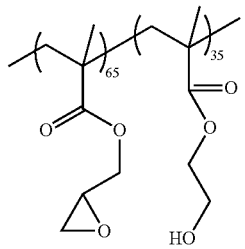

PHEMAGCMA (35/65)

To a round bottom flask equipped with condenser, thermometer, an argon inlet and a magnetic stirrer bar, the following were added: 2-hydroxyethyl methacrylate (HEMA) monomer (3.64 g, 0.028 mole), glycidyl methacrylate (GCMA) monomer (7.39 g, 0.052 mole), AIBN (0.525 g, 4% of total moles of monomers), and ~40 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature for three days. The molecular weight (MW) was determined to be about 25,028 g/mol as determined by gel permeation chromatography (GPC) using a Waters model 150-C in THF at 28° C. calibrated with polystyrene standards.

Example 12

Synthesis of Copolymer of 1,1,1,3,3,3-Hexafluoroisopropyl Acrylate and Glycidyl Methacrylate (PHFIPAGCMA (50/50))

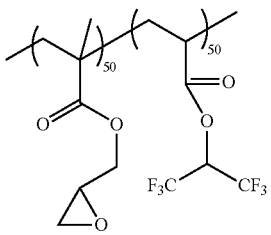

PHFIPAGCMA (50/50)

To a round bottom flask equipped with condenser, thermometer, an argon inlet and a magnetic stirrer bar, the following were added: 1,1,1,3,3,3-hexafluoroisopropyl acrylate (HFIPA) monomer (3.33 g, 0.015 mole), glycidyl methacrylate (GCMA) monomer (2.13 g, 0.015 mole), AIBN (0.197 g, 4% of total moles of monomers), and ~20 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was washed with hexane, and then dried by vacuum oven at room temperature overnight. The molecular weight (MW) was determined to be about 12,499 g/mol as determined by gel permeation chromatography (GPC) using a Waters model 150-C in THF at 28° C. calibrated with polystyrene standards.

Example 13

Synthesis of copolymer of 1,1,1-trifluoro-2-(trifluoromethyl)-pentan-2-ol-4-yl methacrylate and glycidyl methacrylate (PIPRHFAMAGCMA (40/60))

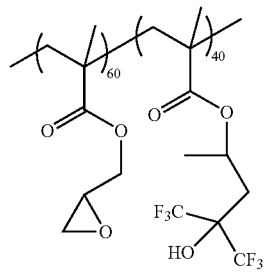

PIPRHFAMAGCMA (40/60)

To a round bottom flask equipped with condenser, thermometer, an argon inlet and a magnetic stirrer bar, the following were added: 1,1,1-trifluoro-2-(trifluoromethyl)-pentan-2-ol-4-yl methacrylate) (IPRHFAMA) monomer (5.88 g, 0.02 mole), glycidyl methacrylate (GCMA) monomer (4.26 g, 0.03 mole), AIBN (0.328 g, 4% of total moles of monomers), and ~35 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 26,180 g/mol as determined by gel permeation chromatography (GPC) using a Waters model 150-C in THF at 28° C. calibrated with polystyrene standards.

Example 14

Synthesis of copolymer of 1,1,1-trifluoro-2-(trifluoromethyl)-pentan-2-of-4-yl methacrylate and glycidyl methacrylate (PiPrHFAMAGCMA (20/80))

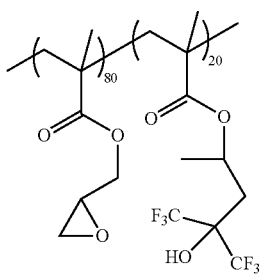

PiPrHFAMAGCMA (20/80)

To a round bottom flask equipped with condenser, thermometer, an argon inlet and a magnetic stirrer bar, the following were added: 1,1,1-trifluoro-2-(trifluoromethyl)-pentan-2-ol-4-yl methacrylate) (iPrHFAMA) monomer (4.41 g, 0.015 mole), glycidyl methacrylate (GCMA) monomer (8.53 g, 0.06 mole), AIBN (0.328 g, 4% of total moles of monomers), and ~40 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 26,862 g/mol as determined by gel permeation chromatography (GPC) using a Waters model 150-C in THF at 28° C. calibrated with polystyrene standards.

Example 15

Synthesis of Homopolymer of 3,4-Epoxycyclohexylmethyl Methacrylate (PEPCHMMA)

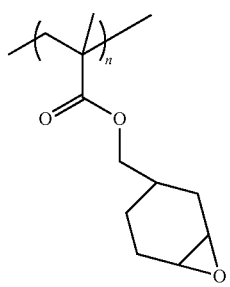

PEPCHMMA

To a round bottom flask equipped with condenser, thermometer, an argon inlet and a magnetic stirrer bar, the following were added: 3,4-epoxycyclohexylmethyl methacrylate (EPCHMMA) monomer (3.92 g, 0.02 mole), AIBN (0.131 g, 4% of total moles of monomers), and ~16 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The solid collected was dried by vacuum oven at room temperature overnight. The molecular weight (MW) was determined to be about 27,828 g/mol as determined by gel permeation chromatography (GPC) using a Waters model 150-C in THF at 28° C. calibrated with polystyrene standards.

Example 16

Synthesis of Copolymer of 3,4-Epoxycyclohexylmethyl Methacrylate and Styrene (PEPCHMMAST (70/30))

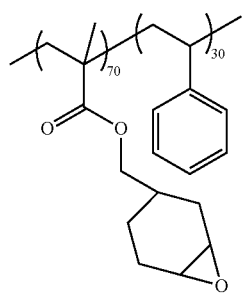

PEPCHMMAST (70/30)

To a round bottom flask equipped with condenser, thermometer, an argon inlet and a magnetic stirrer bar, the following were added: 3,4-epoxycyclohexylmethyl methacrylate (EPCHMMA) monomer (6.86 g, 0.035 mole), styrene (ST) monomer (1.56 g, 0.015 mole), AIBN (0.328 g, 4% of total moles of monomers), and ~44 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 13,534 g/mol as determined by gel permeation chromatography (GPC) using a Waters model 150-C in THF at 28° C. calibrated with polystyrene standards.

While there have been shown and described what are presently believed to be the preferred embodiments of the present invention, those skilled in the art will realize that other and further embodiments can be made without departing from the spirit and scope of the invention described in this application, and this application includes all such modifications that are within the intended scope of the claims set forth herein.

The invention claimed is:

1. A curable liquid formulation comprising:
   (i) at least one near-infrared absorbing polymethine dye;
   (ii) at least one crosslinkable polymer comprising at least one crosslinkable unit, wherein the crosslinkable polymer is a copolymer, terpolymer, or higher order polymer comprising at least one aromatic- or polycyclic-containing unit selected from the group consisting of:

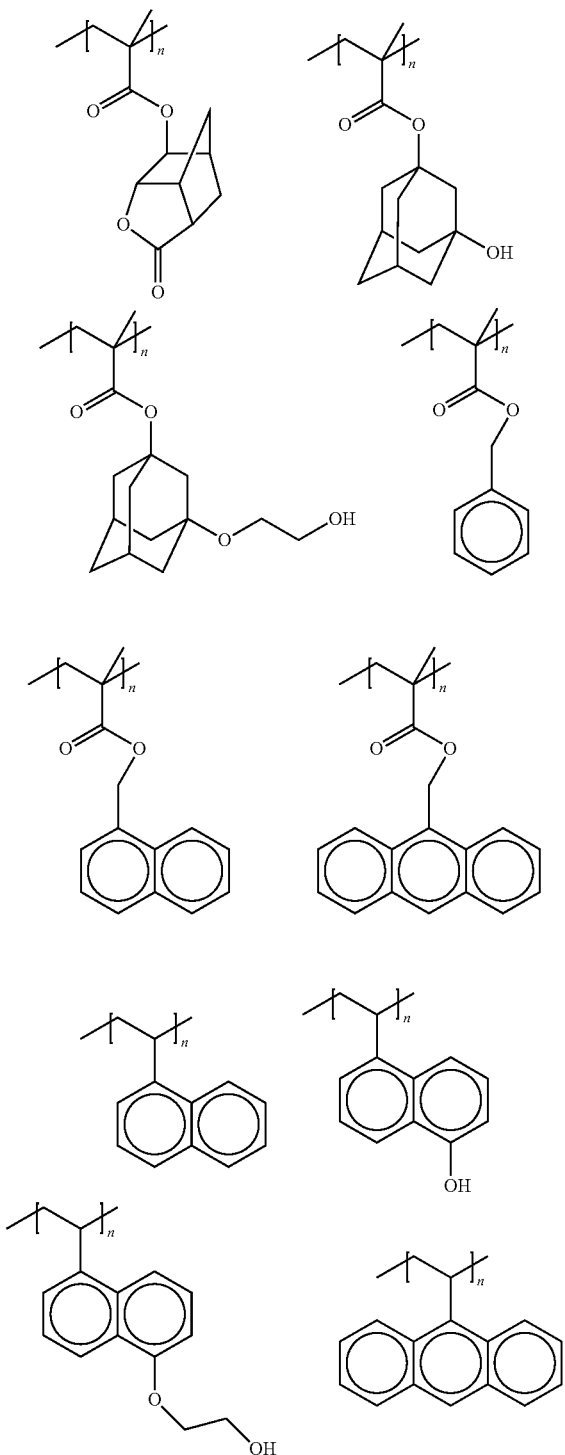

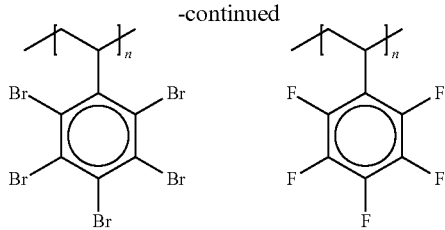

wherein n is a value of at least 1;
   (iii) at least one casting solvent; and
   (iv) an acid generator selected from:

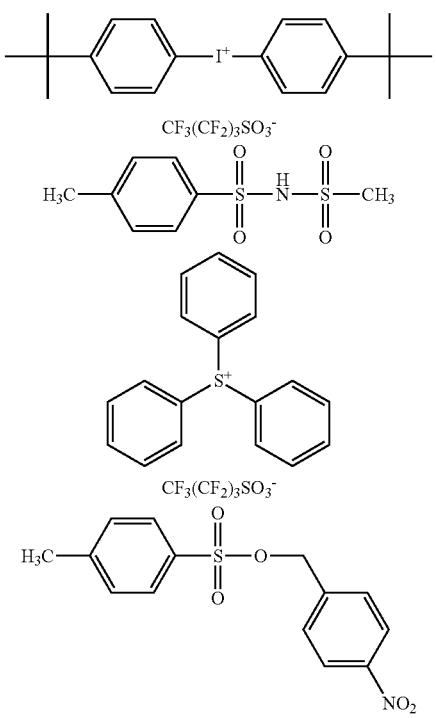

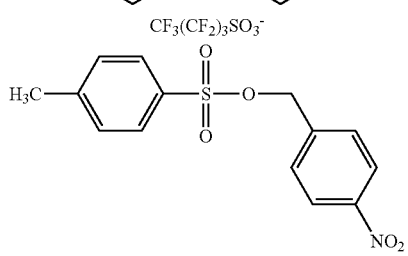

and triethylammonium nonafluorobutane sulfonate.

2. The liquid formulation of claim 1, further comprising one or more inter-polymer crosslinking agents.

3. The liquid formulation of claim 1, further comprising one or more surfactants.

4. The liquid formulation of claim 1, wherein at least one polymethine dye absorbs electromagnetic radiation within a wavelength range of 500 nm to 1200 nm.

5. The liquid formulation of claim 1, wherein the at least one polymethine dye has a formula within the following generic formula:

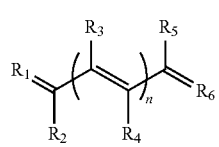

(1)

wherein $R_1$ or a cyclic interconnection of $R_1$ and $R_2$ represents a nitrogen-, oxygen-, and/or sulfur-containing monocyclic ring or polycyclic ring system, or a hydrocarbon group derivatized with an acyclic amino group; $R_6$ or a cyclic interconnection of $R_5$ and $R_6$ represents a nitrogen-, oxygen-, and/or sulfur-containing monocyclic ring or polycyclic ring system, or a hydrocarbon group derivatized with an acyclic amino group; $R_2$, $R_3$, $R_4$, and $R_5$ are each independently selected from (i) a hydrogen atom, or (ii) halide atom, or (iii) cyanide group, or (iv) hydroxy group, or (v) a hydrocarbon group containing at least one carbon atom, wherein a hydrocarbon group optionally includes one or more heteroatoms selected from nitrogen, oxygen, sulfur, and halides, or (vi) a group of formula —$XR_8$ wherein X is O or S and $R_8$ is a hydrocarbon group optionally containing one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group optionally containing one or more heteroatoms selected from oxygen, nitrogen, and sulfur atoms; wherein when any two of $R_2$, $R_3$, $R_4$, and $R_5$ are hydrocarbon groups, they can interconnect to form a five- or six-membered ring; and subscript n is a value of at least 1 and up to 16; and wherein one or more of the nitrogen, oxygen, or sulfur atoms are either in a neutral or positively charged state, and if in a positive state, an anion is associated with the polymethine dye.

6. The liquid formulation of claim 5, wherein the at least one polymethine dye has a formula within the following generic formula:

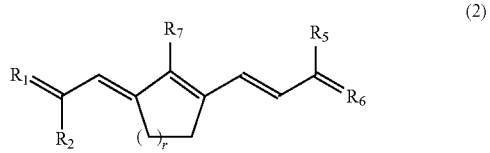

(2)

wherein $R_1$ or a cyclic interconnection of $R_1$ and $R_2$ represents a nitrogen-, oxygen-, and/or sulfur-containing monocyclic ring or polycyclic ring system, or a hydrocarbon group derivatized with an acyclic amino group; $R_6$ or a cyclic interconnection of $R_5$ and $R_6$ represents a nitrogen-, oxygen-, and/or sulfur-containing monocyclic ring or polycyclic ring system, or a hydrocarbon group derivatized with an acyclic amino group; $R_7$ is selected from (i) a hydrogen atom, or (ii) halide atom, or (iii) cyanide group, or (iv) hydroxy group, or (v) a hydrocarbon group containing at least one carbon atom, wherein a hydrocarbon group optionally includes one or more heteroatoms selected from nitrogen, oxygen, sulfur, and halides, or (vi) a group of formula —$XR_8$ wherein X is O or S and $R_8$ is a hydrocarbon group optionally containing one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group optionally containing one or more heteroatoms selected from oxygen, nitrogen, and sulfur atoms; and subscript r can be a value of 1 or 2.

7. The liquid formulation of claim 5, wherein the at least one polymethine dye has a formula within the following generic formula:

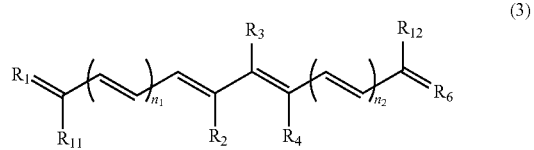

(3)

wherein $R_1$ or a cyclic interconnection of $R_1$ and $R_{11}$ represents a nitrogen-, oxygen-, and/or sulfur-containing monocyclic ring or polycyclic ring system; $R_6$ or a cyclic interconnection of $R_6$ and $R_{12}$ represents a nitrogen-, oxygen-, and/or sulfur-containing monocyclic ring or polycyclic ring system; $R_2$, $R_3$, $R_4$, $R_{11}$, and $R_{12}$ are each independently selected from (i) a hydrogen atom, or (ii) halide atom, or (iii) cyanide group, or (iv) hydroxy group, or (v) a hydrocarbon group containing at least one carbon atom, wherein a hydrocarbon group optionally includes one or more heteroatoms selected from nitrogen, oxygen, sulfur, and halides, or (vi) a group of formula —$XR_8$ wherein X is O or S and $R_8$ is a hydrogen atom or a hydrocarbon group optionally containing one or more heteroatoms selected from oxygen, nitrogen, and sulfur atoms, or (vii) a group of formula —$NR_9R_{10}$ wherein $R_9$ and $R_{10}$ are each independently a hydrocarbon group optionally containing one or more heteroatoms selected from oxygen, nitrogen, and sulfur atoms; wherein when any two of $R_2$, $R_3$, and $R_4$ are hydrocarbon groups, they can interconnect to form a five- or six-membered ring; and subscripts $n_1$ and $n_2$ each independently have a value of 0 or a number of 1 to 6.

8. The liquid formulation of claim 5, wherein the at least one polymethine dye has a formula within the following generic formula:

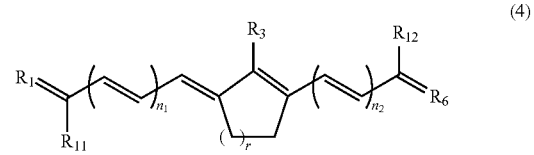

(4)

wherein $R_1$ or a cyclic interconnection of $R_1$ and $R_{11}$ represents a nitrogen-, oxygen-, and/or sulfur-containing monocyclic ring or polycyclic ring system; $R_6$ or a cyclic interconnection of $R_6$ and $R_{12}$ represents a nitrogen-, oxygen-, and/or sulfur-containing monocyclic ring or polycyclic ring system; $R_3$, $R_{11}$, and $R_{12}$ are each independently selected from (i) a hydrogen atom, or (ii) halide atom, or (iii) cyanide group, or (iv) hydroxy group, or (v) a hydrocarbon group containing at least one carbon atom, wherein a hydrocarbon group optionally includes one or more heteroatoms selected from nitrogen, oxygen, sulfur, and halides, or (vi) a group of formula —$XR_8$ wherein X is O or S and $R_8$ is a hydrocarbon group optionally containing one or more heteroatoms selected from oxygen, nitrogen, and sulfur atoms, or (vii) a group of formula —$NR_9R_{10}$ wherein $R_9$ and $R_{10}$ are each independently a hydrogen atom or hydrocarbon group optionally containing one or more heteroatoms selected from oxygen, nitrogen, and sulfur atoms; subscript r can be a value of 1 or 2; and subscripts $n_1$ and $n_2$ each independently have a value of 0 or a number of 1 to 6.

* * * * *